(12) United States Patent
Feig et al.

(10) Patent No.: US 10,733,524 B1
(45) Date of Patent: Aug. 4, 2020

(54) QUANTUM D-STATE AC-STARK SHIFT GATE

(71) Applicant: Honeywell International Inc., Morris Plains, NJ (US)

(72) Inventors: Michael Feig, Morris Plains, NJ (US); Jonathon Sedlacek, Morris Plains, NJ (US); Mark Kokish, Morris Plains, NJ (US); Christopher Langer, Morris Plains, NJ (US); John Gaebler, Morris Plains, NJ (US); Daniel Stack, Morris Plains, NJ (US); Bryce J. Bjork, Morris Plains, NJ (US); Grahame Vittorini, Morris Plains, NJ (US); David Hayes, Morris Plains, NJ (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/717,535

(22) Filed: Dec. 17, 2019

Related U.S. Application Data

(60) Provisional application No. 62/845,741, filed on May 9, 2019.

(51) Int. Cl.
  *G06N 10/00* (2019.01)
  *H03K 19/02* (2006.01)
(52) U.S. Cl.
  CPC ............ *G06N 10/00* (2019.01); *H03K 19/02* (2013.01)

(58) Field of Classification Search
  None
  See application file for complete search history.

(56) References Cited

U.S. PATENT DOCUMENTS

| | | | |
|---|---|---|---|
| 10,418,443 B1* | 9/2019 | Nordquist | H01L 29/66977 |
| 2009/0321719 A1* | 12/2009 | Folman | G06N 10/00 257/25 |
| 2011/0290995 A1* | 12/2011 | Kumph | H01J 49/0018 250/282 |
| 2019/0378033 A1* | 12/2019 | Figgatt | G06N 10/00 |
| 2020/0082291 A1* | 3/2020 | Debnath | G06N 10/00 |

* cited by examiner

*Primary Examiner* — Minh D A
*Assistant Examiner* — James H Cho
(74) *Attorney, Agent, or Firm* — Alston & Bird LLP

(57) ABSTRACT

A quantum computing D-state AC-Stark shift gate system comprises at least one gate manipulation source and one or more ions trapped in an ion trap. The at least one gate manipulation source is configured to generate a first gate manipulation signal and a second gate manipulation signal. The first and second gate manipulation signals couple an ion between a set of S-states and a set of D-states. The first and second gate manipulation signals apply a force to an ion of the one or more ions that is dependent on the internal state of the ion. The first and second gate manipulation signals are configured to couple internal states of the ions to their motional state without appreciably altering a population of the ions within the set of S-states.

Figure 1:
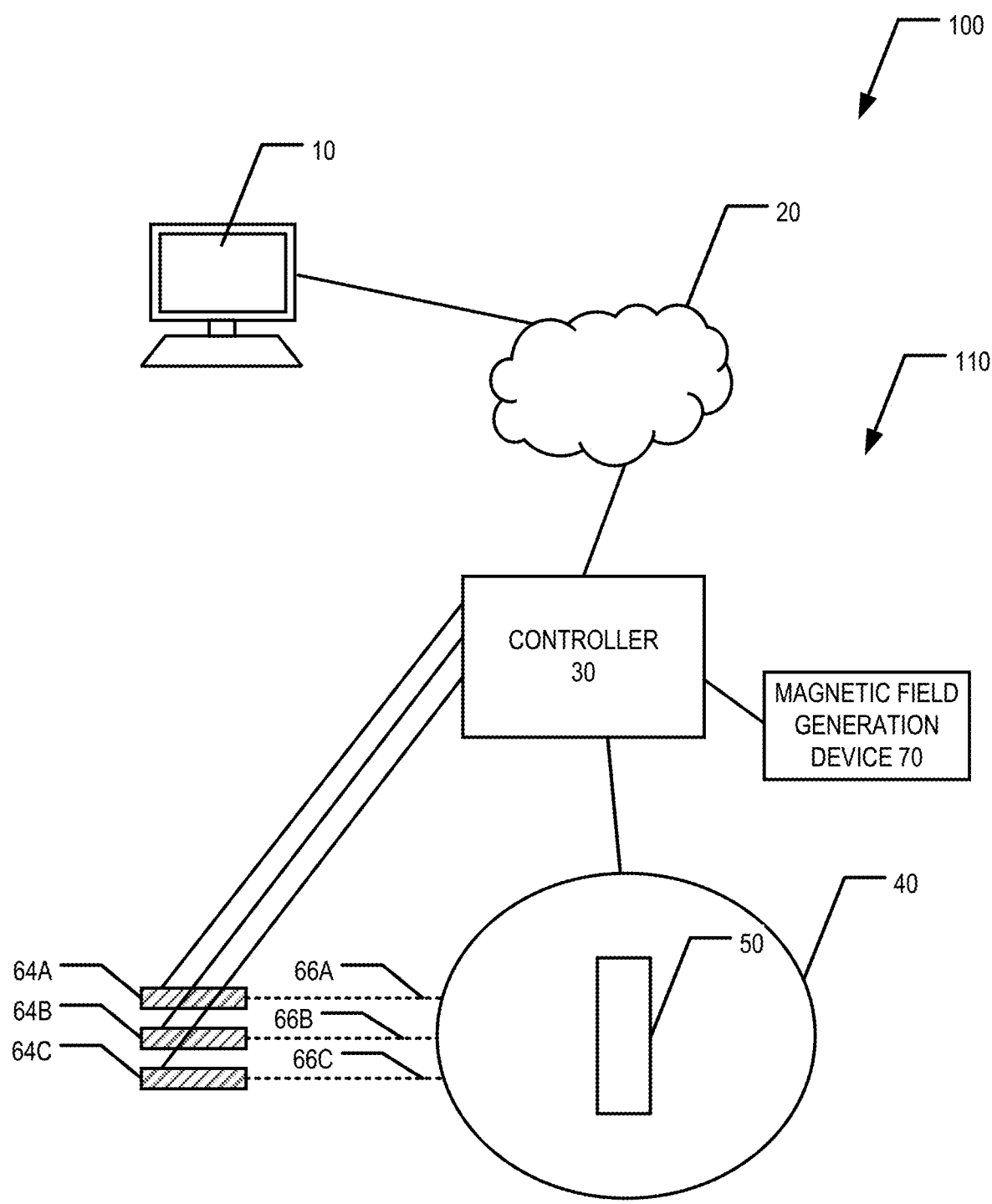

20 Claims, 12 Drawing Sheets

QUANTUM D-STATE AC-STARK SHIFT GATE

CROSS-REFERENCE TO RELATED APPLICATIONS

This application claims priority to U.S. Provisional Application No. 62/845,741, filed May 19, 2019; the contents of which are hereby incorporated by reference in their entirety.

TECHNICAL FIELD

Embodiments described herein generally relate to quantum computing. For example, various embodiments relate to a laser-based quantum logic gate.

BACKGROUND

Quantum computing may be used to perform advanced computational processing. Quantum logic gates (e.g., controlled NOT gates, Hadamard gates, and/or the like) may be used to provide reliable and fault-tolerant quantum computation. The operation of quantum logic gates in trapped-ion quantum computers often requires lasers that operate using high input power or operate at technologically challenging, difficult, or otherwise inconvenient (e.g., small) wavelengths. These requirements make fast and reliable quantum gates difficult to implement, which may impede scalability in some examples. Through applied effort, ingenuity, and innovation many deficiencies of such systems have been solved by developing solutions that are structured in accordance with the embodiments of the present invention, many examples of which are described in detail herein.

BRIEF SUMMARY OF EXAMPLE EMBODIMENTS

Example embodiments provide methods for performing D-state AC-Stark shift gate operations and quantum computers, systems, and/or apparatus configured for performing D-state AC-Stark shift gate operations.

According to one aspect, a quantum computing D-state AC-Stark shift gate system is provided. In an example embodiment, the system comprises a first gate manipulation source configured to generate a first gate manipulation signal at a first laser wavelength; a second gate manipulation source configured to generate a second gate manipulation signal at a second laser wavelength; an ion trap; and one or more ions trapped within the ion trap. The first gate manipulation signal and the second gate manipulation signal are each configured to couple a set of S-states (e.g., states of a qubit space) and a set of D-states of the one or more ions. The first and second gate manipulation signals are configured to apply a force to an ion of the one or more ions that is dependent on the internal state of the ion. The first and second gate manipulation signals are configured to couple internal states of the one or more ions to their motional state without appreciably altering a population of the one or more ions within the set of S-states. Here, without appreciably altering a population of ions within the set of S-states means that transfer of population between states within the set of S-states induced by the laser coupling will be completely negligible, and in particular will be well below the transfer of population between said S-states due to spontaneous decay from the D-states during the gate, which is already below the $10^{-4}$ level.

In an example embodiment, the system includes a magnetic field generating device to generate a magnetic field. In an example embodiment, the second gate manipulation signal propagates in a direction not parallel to the first gate manipulation signal. In an example embodiment, the second gate manipulation signal propagates in a direction approximately perpendicular to the first gate manipulation signal. In an example embodiment, the first gate manipulation signal is polarized having a first orientation; and the second gate manipulation signal is polarized having a second orientation substantially perpendicular to the first orientation, wherein the polarizations lie within a plane defined by the propagation directions of the two gate manipulation signals. In an example embodiment, the first gate manipulation signal is polarized in a plane having a first orientation; and the second gate manipulation signal is polarized out of the plane having a second orientation substantially perpendicular to the first orientation, wherein the plane is defined by the propagation directions of the two gate manipulation signals. In an example embodiment, the second gate manipulation signal propagates in a direction approximately opposite to the first gate manipulation signal. In an example embodiment, the second gate manipulation signal propagates in a direction approximately parallel to the first gate manipulation signal. In an example embodiment, the first and second gate manipulation signals are modulations of a common gate manipulation signal. In an example embodiment, the first gate manipulation source is configured to couple the ion off-resonantly between a subset of the S-states and a subset of the D-states and the second gate manipulation source is configured to couple the ion off-resonantly between said subset of S-states and said subset of D-states. In an example embodiment, the first laser wavelength is a first visible spectrum laser wavelength, and the second laser wavelength is a second visible spectrum laser wavelength. In an example embodiment, the first laser wavelength is a first infrared or ultra-violet spectrum laser wavelength, and the second laser wavelength is a second infrared or ultra-violet spectrum laser wavelength. In an example embodiment, the first laser wavelength and the second laser wavelength are detuned outside a hyperfine manifold of the set of D-states. In an example embodiment, the first laser wavelength and the second laser wavelength are detuned within a hyperfine manifold of the set of D-states. In an example embodiment, the first laser wavelength and the second laser wavelength are detuned symmetrically within a hyperfine manifold of the set of D-states. In an example embodiment, the one or more ions comprises ytterbium-171 and the first gate manipulation signal and the second gate manipulation signal comprise an approximately 435 nm laser pulse. In an example embodiment, the first gate manipulation signal and the second gate manipulation signal include a pulse shaping modulation to reduce the population of the D-states upon completion of the gate operation. In an example embodiment, the pulse shaping modulation involves a rise and fall modulation in the form $\sin^2(t)$. In an example embodiment, the one or more ions are ions that have a low-lying D-state. In an example embodiment, the one or more ions comprise at least one of singly ionized ytterbium, singly ionized barium, singly ionized strontium, or singly ionized calcium.

According to another aspect, a method for performing a quantum computing D-state AC-Stark shift gate operation is provided. In an example embodiment, the method comprises generating a first gate manipulation signal using a first gate manipulation source. The first gate manipulation source is at a first laser wavelength and is configured to couple a set of S-states to a set of D-states of one or more ions trapped within an ion trap. The method further comprises generating a second gate manipulation signal using a second gate manipulation source. The second gate manipulation source is at a second laser wavelength and is configured to couple the set of S-states to the set of D-states of the one or more ions. The method further comprises applying the first and second gate manipulation signals to the one or more ions. The force applied to an ion of the one or more ions by the first and second gate manipulation signals is dependent on the internal state of the ion. The first and second gate manipulation signals are configured to couple internal states of the one or more ions to their motional state, without appreciably altering a population of the one or more ions within the set of S-states.

In an example embodiment, the system includes a magnetic field generating device to generate a magnetic field. In an example embodiment, the second gate manipulation signal propagates in a direction not parallel to the first gate manipulation signal. In an example embodiment, the second gate manipulation signal propagates in a direction approximately perpendicular to the first gate manipulation signal. In an example embodiment, the first gate manipulation signal is polarized having a first orientation; and the second gate manipulation signal is polarized having a second orientation substantially perpendicular to the first orientation, wherein the polarizations lie within a plane defined by the propagation directions of the two gate manipulation signals. In an example embodiment, the first gate manipulation signal is polarized in a plane having a first orientation; and the second gate manipulation signal is polarized out of the plane having a second orientation substantially perpendicular to the first orientation, wherein the plane is defined by the propagation directions of the two gate manipulation signals. In an example embodiment, the second gate manipulation signal propagates in a direction approximately opposite to the first gate manipulation signal. In an example embodiment, the second gate manipulation signal propagates in a direction approximately parallel to the first gate manipulation signal. In an example embodiment, the first and second gate manipulation signals are modulations of a common gate manipulation signal. In an example embodiment, the first gate manipulation source is configured to couple the ion off-resonantly between a subset of the S-states and a subset of the D-states and the second gate manipulation source is configured to couple the ion off-resonantly between said subset of S-states and said subset of D-states. In an example embodiment, the first laser wavelength is a first visible spectrum laser wavelength, and the second laser wavelength is a second visible spectrum laser wavelength. In an example embodiment, the first laser wavelength is a first infrared or ultra-violet spectrum laser wavelength, and the second laser wavelength is a second infrared or ultra-violet spectrum laser wavelength. In an example embodiment, the first laser wavelength and the second laser wavelength are detuned outside a hyperfine manifold of the set of D-states. In an example embodiment, the first laser wavelength and the second laser wavelength are detuned within a hyperfine manifold of the set of D-states. In an example embodiment, the first laser wavelength and the second laser wavelength are detuned symmetrically within a hyperfine manifold of the set of D-states. In an example embodiment, the one or more ions comprises ytterbium-171 and the first gate manipulation signal and the second gate manipulation signal comprise an approximately 435 nm laser pulse. In an example embodiment, the first gate manipulation signal and the second gate manipulation signal include a pulse shaping modulation to reduce the population of the D-states upon completion of the gate operation. In an example embodiment, the pulse shaping modulation involves a rise and fall modulation in the form $\sin^2(t)$. In an example embodiment, the one or more ions are ions that have a low-lying D-state. In an example embodiment, the one or more ions comprise at least one of singly ionized ytterbium, singly ionized barium, singly ionized strontium, or singly ionized calcium.

According to yet another aspect, a non-transitory, machine-readable storage medium comprising a plurality of instructions that, when executed with a processor of a device (e.g., a processing element of a controller of a trapped-ion quantum computer), cause the device to perform a D-state AC-Stark shift gate. In an example embodiment, when the plurality of instructions is executed with the processor of the device, the device is caused to cause a first gate manipulation source to generate a first gate manipulation signal. The first gate manipulation source is at a first laser wavelength and is configured to couple a set of S-states to a set of D-states of one or more ions trapped within an ion trap. When the plurality of instructions is executed with the processor of the device, the device is further caused to cause a second gate manipulation source to generate a second gate manipulation signal. The second gate manipulation source is at a second laser wavelength and is configured to couple the set of S-states to the set of D-states of the one or more ions. When the plurality of instructions is executed with the processor of the device, the device is further caused to cause the first and second gate manipulation signals to be applied to the one or more ions. The force applied to an ion of the one or more ions by the first and second gate manipulation signals is dependent on the internal state of the ion. The first and second gate manipulation signals are configured to couple internal states of the one or more ions to their motional state, without appreciably altering a population of the one or more ions within the set of S-states In an example embodiment, the system includes a magnetic field generating device to generate a magnetic field. In an example embodiment, the second gate manipulation signal propagates in a direction not parallel to the first gate manipulation signal. In an example embodiment, the second gate manipulation signal propagates in a direction approximately perpendicular to the first gate manipulation signal. In an example embodiment, the first gate manipulation signal is polarized having a first orientation; and the second gate manipulation signal is polarized having a second orientation substantially perpendicular to the first orientation, wherein the polarizations lie within a plane defined by the propagation directions of the two gate manipulation signals. In an example embodiment, the first gate manipulation signal is polarized in a plane having a first orientation; and the second gate manipulation signal is polarized out of the plane having a second orientation substantially perpendicular to the first orientation, wherein the plane is defined by the propagation directions of the two gate manipulation signals. In an example embodiment, the second gate manipulation signal propagates in a direction approximately opposite to the first gate manipulation signal. In an example embodiment, the second gate manipulation signal propagates in a direction approximately parallel to the first gate manipulation signal. In an example embodiment, the first and second gate manipulation signals are modulations of a common gate manipulation signal. In an example embodiment, the first gate manipulation source is configured to couple the ion off-resonantly between a subset of the S-states and a subset of the D-states and the second gate manipulation source is configured to couple the ion off-resonantly between said subset of S-states and said subset of D-states. In an example embodiment, the first laser wavelength is a first visible spectrum laser wavelength, and the second laser wavelength is a second visible spectrum laser wavelength. In an example embodiment, the first laser wavelength is a first infrared or ultra-violet spectrum laser wavelength, and the second laser wavelength is a second infrared or ultra-violet spectrum laser wavelength. In an example embodiment, the first laser wavelength and the second laser wavelength are detuned outside a hyperfine manifold of the set of D-states. In an example embodiment, the first laser wavelength and the second laser wavelength are detuned within a hyperfine manifold of the set of D-states. In an example embodiment, the first laser wavelength and the second laser wavelength are detuned symmetrically within a hyperfine manifold of the set of D-states. In an example embodiment, the one or more ions comprises ytterbium-171 and the first gate manipulation signal and the second gate manipulation signal comprise an approximately 435 nm laser pulse. In an example embodiment, the first gate manipulation signal and the second gate manipulation signal include a pulse shaping modulation to reduce the population of the D-states upon completion of the gate operation. In an example embodiment, the pulse shaping modulation involves a rise and fall modulation in the form $\sin^2(t)$. In an example embodiment, the one or more ions are ions that have a low-lying D-state. In an example embodiment, the one or more ions comprise at least one of singly ionized ytterbium, singly ionized barium, singly ionized strontium, or singly ionized calcium.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 provides block diagram of an example trapped ion quantum computer, in accordance with an example embodiment.

Figure 2:
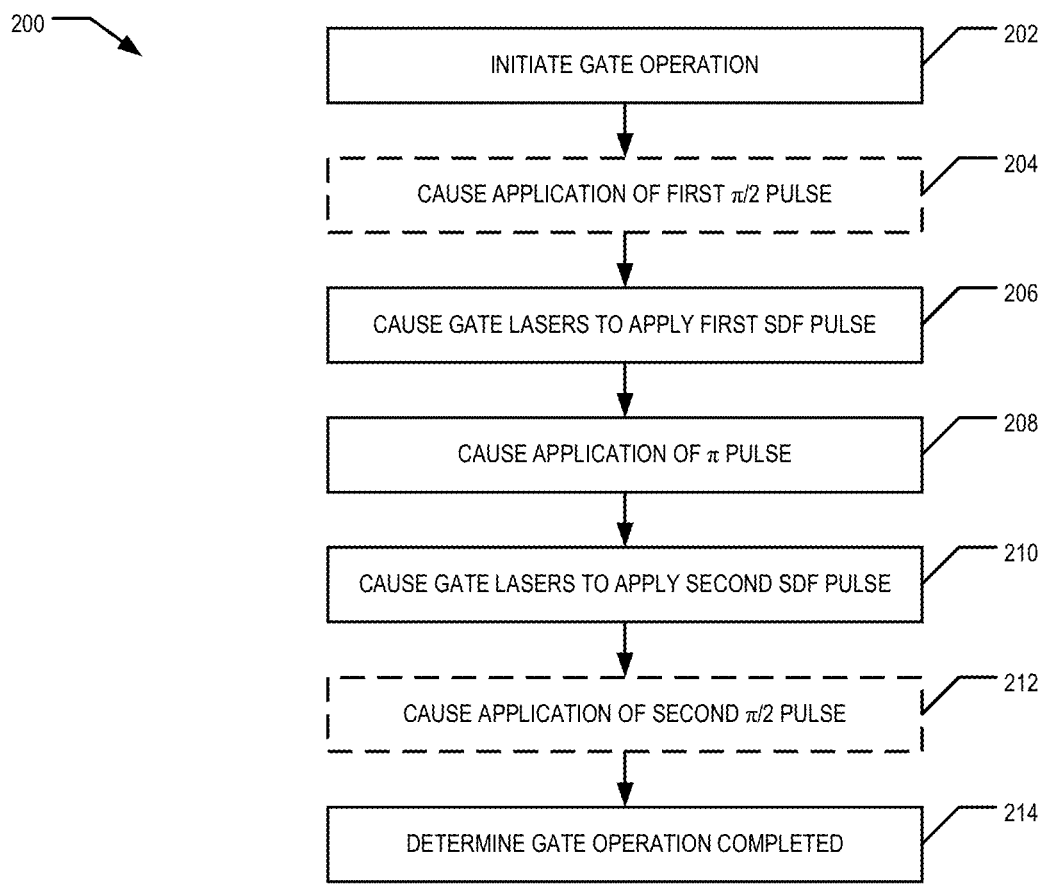

FIG. 2 provides a flowchart illustrating processes, procedures, and operations performed, for example, by a controller of a quantum computer, to perform a phase gate on one or more ions, according to an example embodiment.

Figure 3:
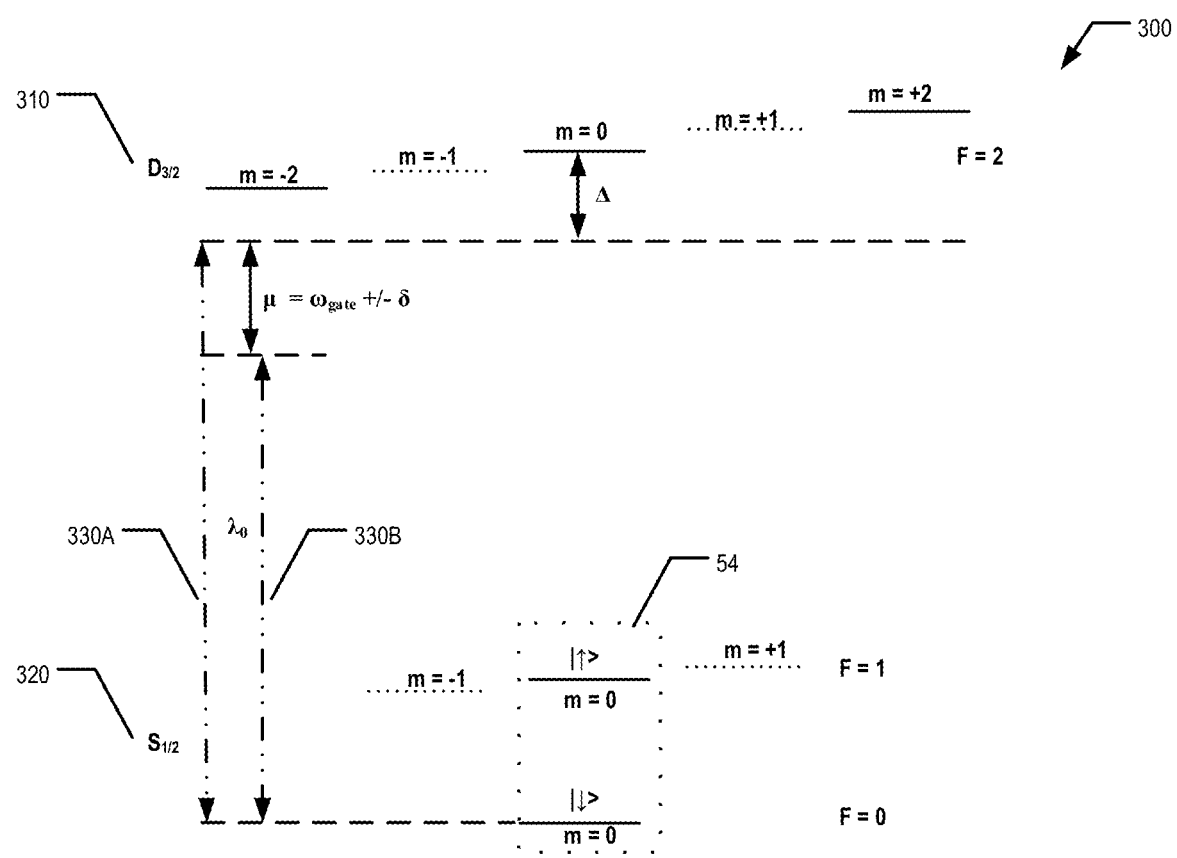

FIG. 3 provides a state transition diagram, according to an example embodiment.

Figure 4:
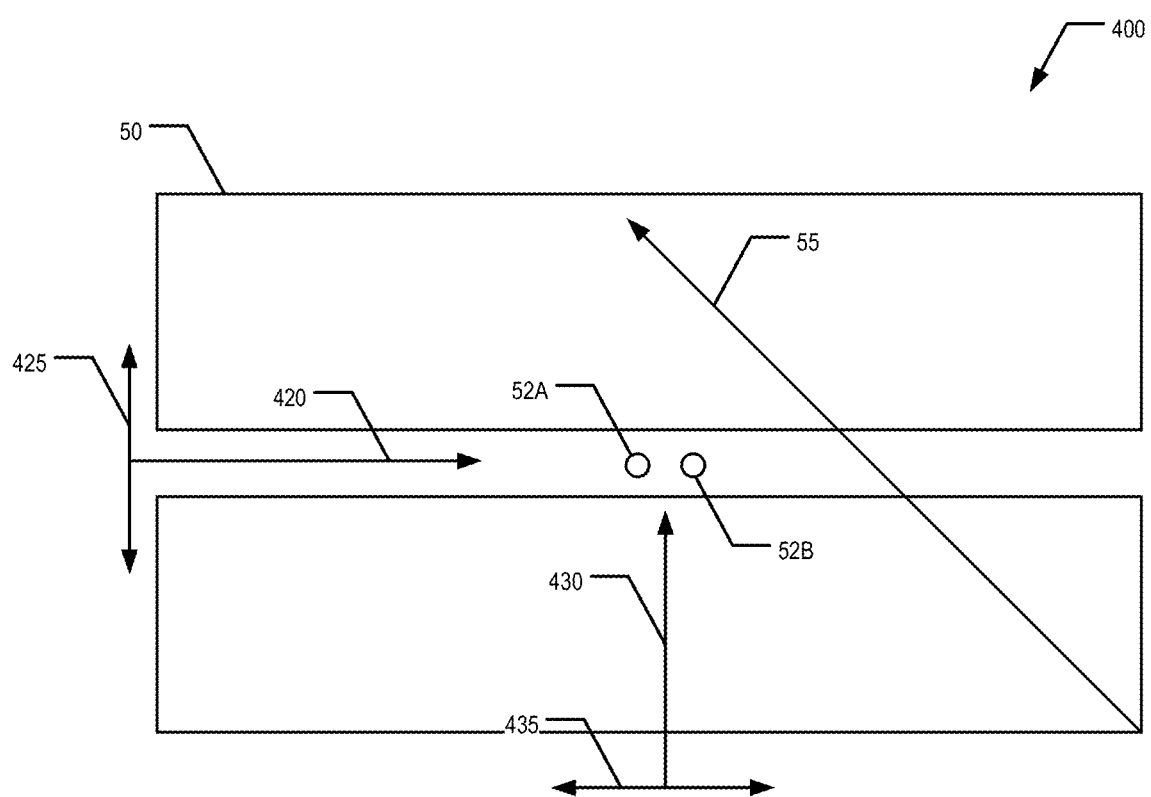

FIG. 4 provides a schematic diagram showing the performance of an example gate on ions trapped in a surface ion trap, according to an example embodiment corresponding to the state transition diagram shown in FIG. 3.

Figure 5:
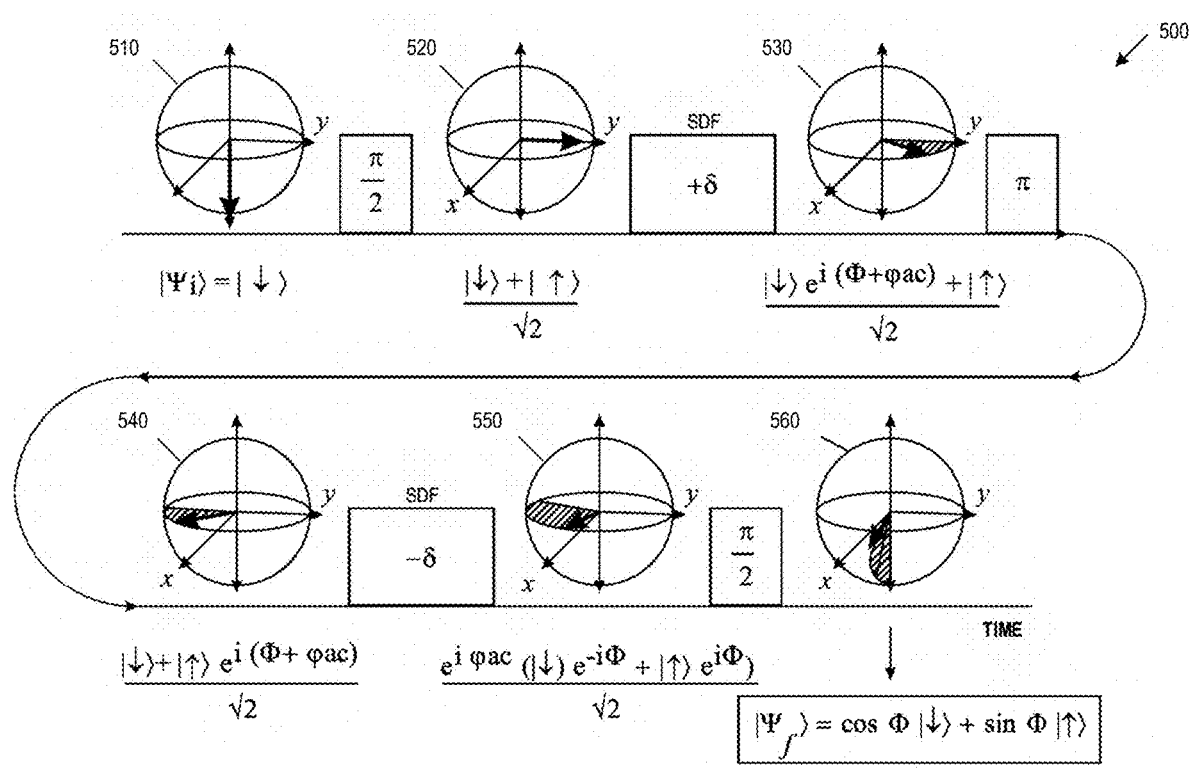

FIG. 5 provides a block diagram showing a Bloch sphere representation of a phase gate protocol, according to an example embodiment corresponding to the state transition diagram shown in FIG. 3.

Figure 6:
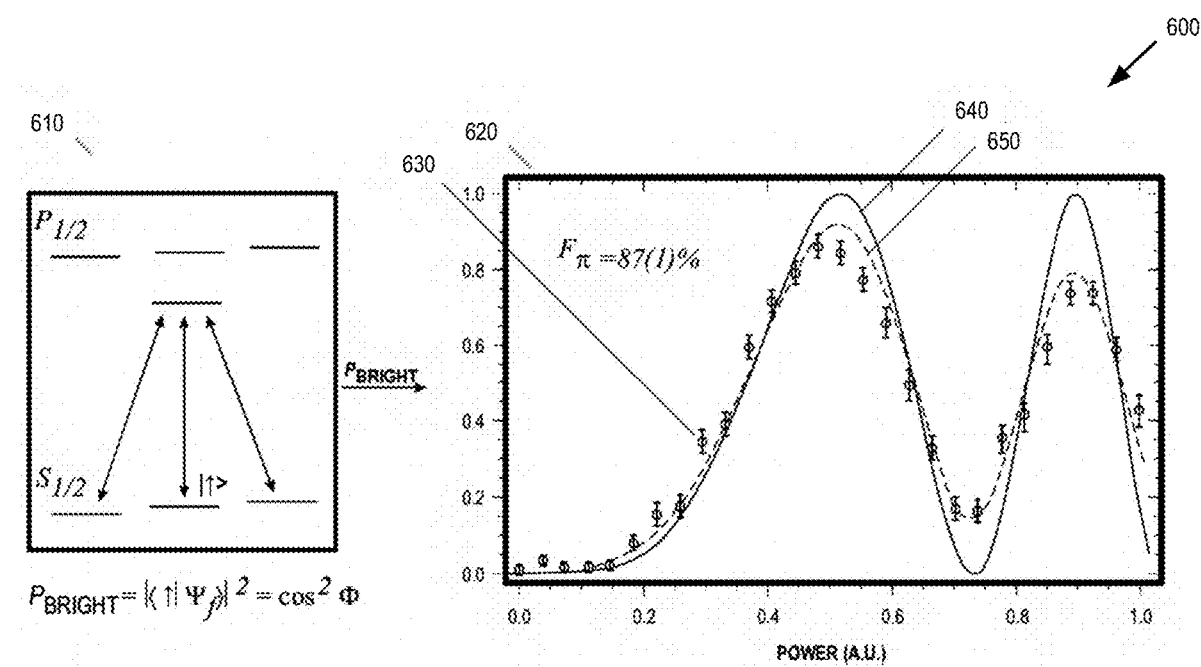

FIG. 6 provides performance measurement results, according to an example embodiment corresponding to the state transition diagram shown in FIG. 3.

Figure 7:
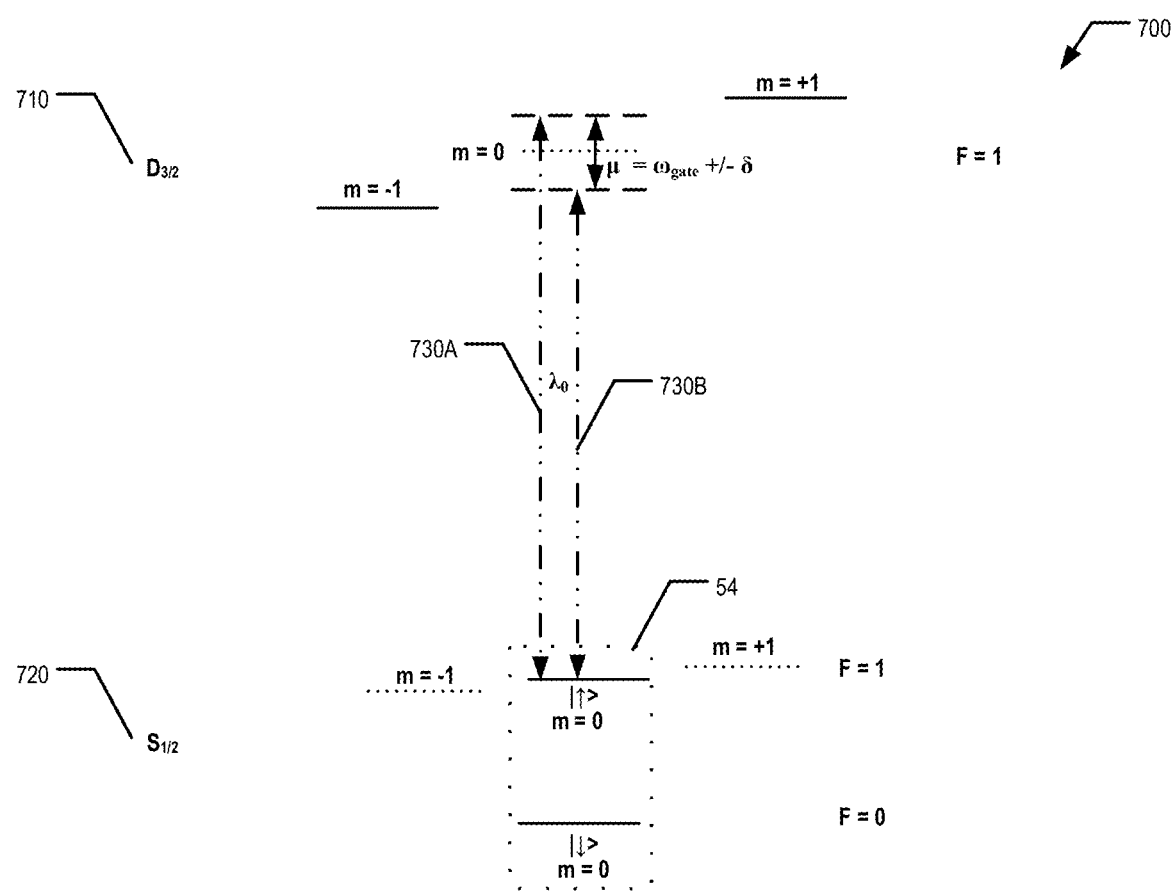

FIG. 7 provides a state transition diagram, according to another example embodiment.

Figure 8:
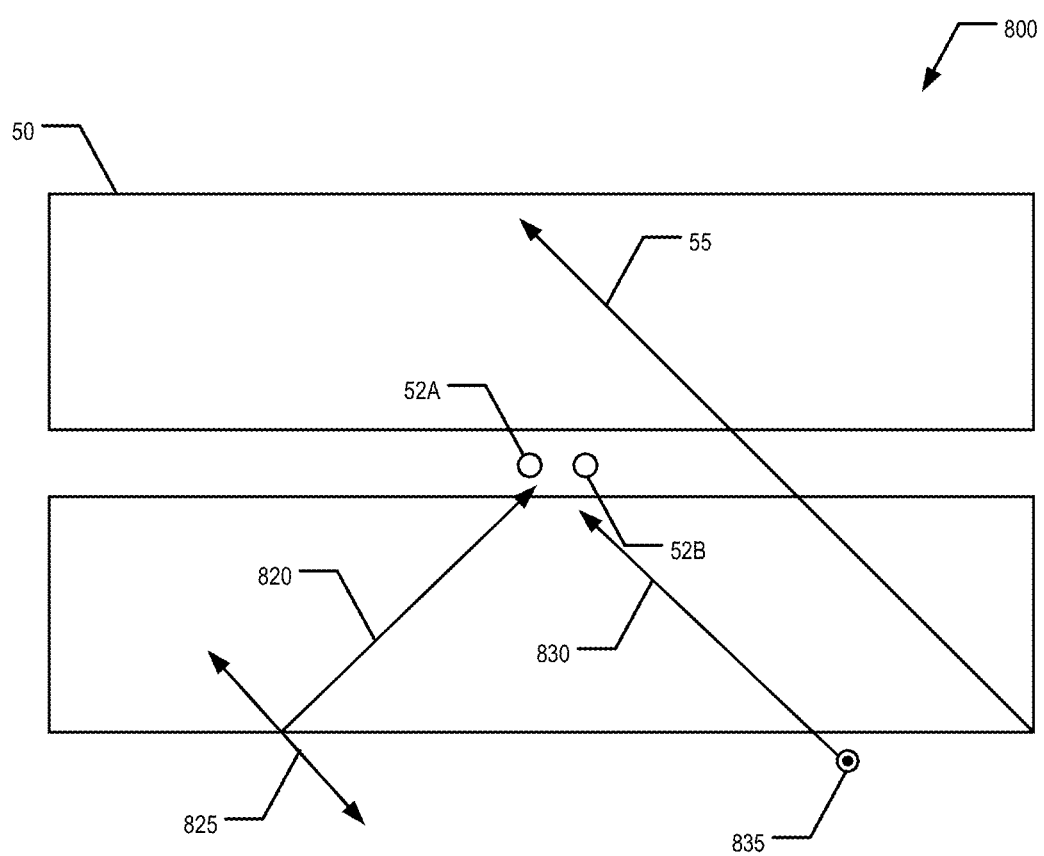

FIG. 8 provides a schematic diagram showing the performance of an example gate on ions trapped in a surface ion trap, according to an example embodiment corresponding to the state transition diagram shown in FIG. 7.

Figure 9:
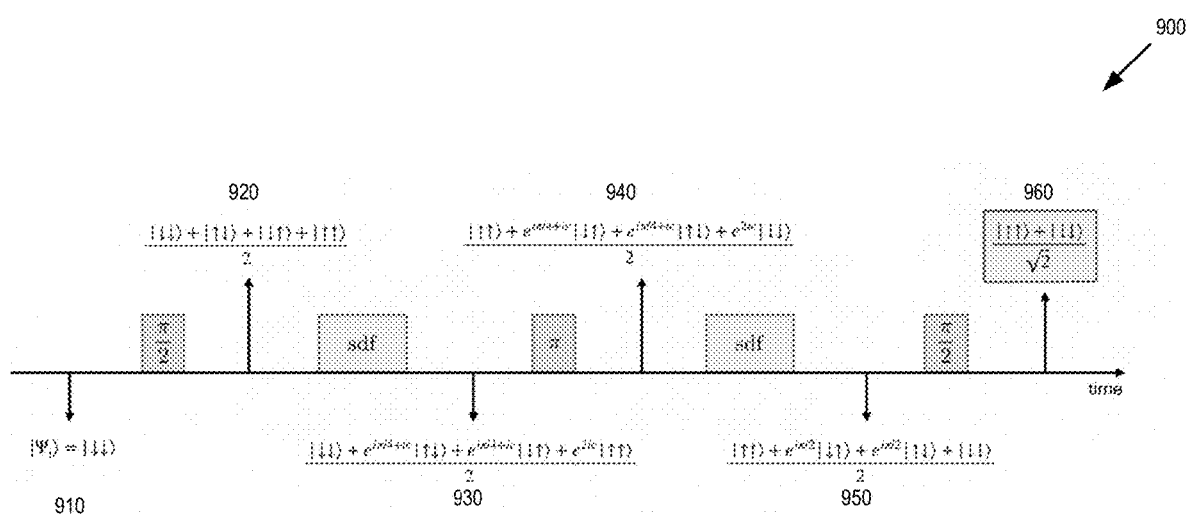

FIG. 9 provides a block diagram showing a representation of a phase gate protocol, according to an example embodiment corresponding to the state transition diagram shown in FIG. 7.

Figure 10:
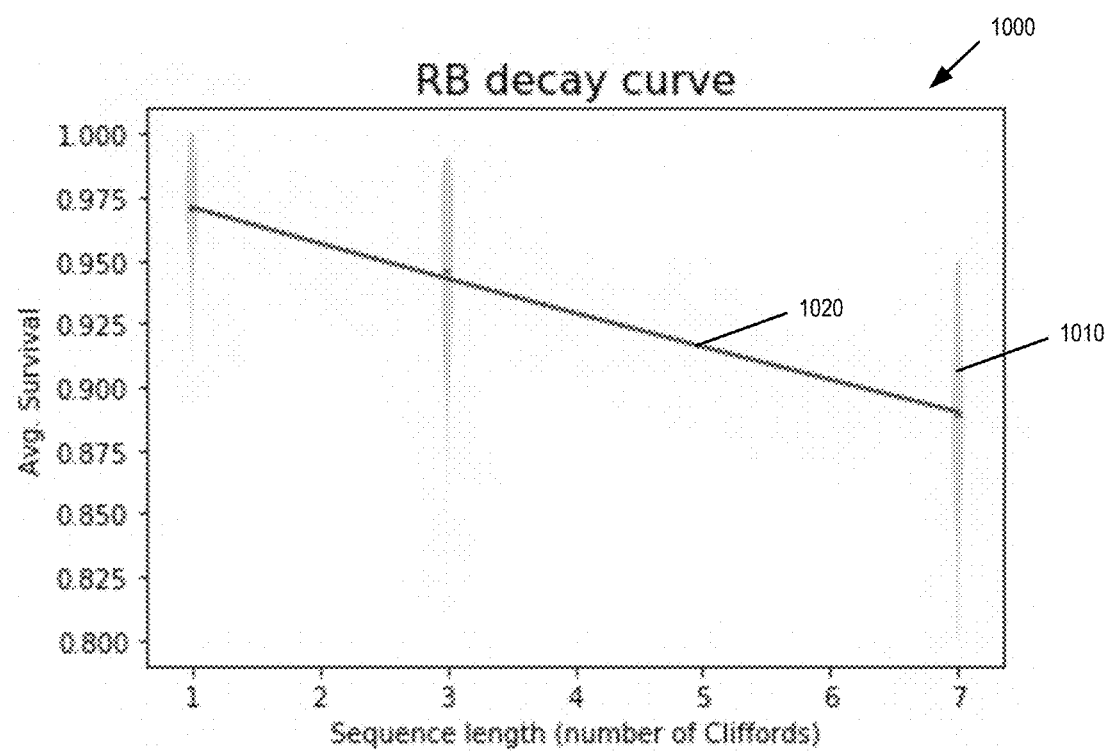

FIG. 10 provides a plot illustrating performance measurement results, according to an example embodiment corresponding to the state transition diagram shown in FIG. 7.

Figure 11:
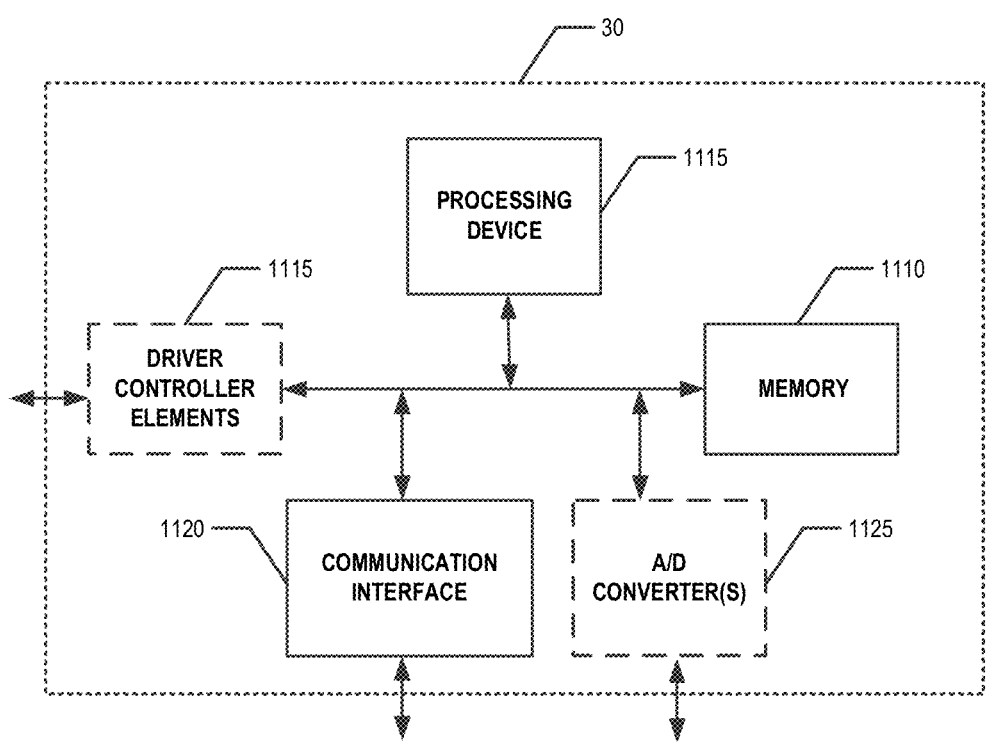

FIG. 11 provides a schematic diagram of an example controller of a quantum computer comprising an ion trap apparatus, in accordance with an example embodiment.

Figure 12:
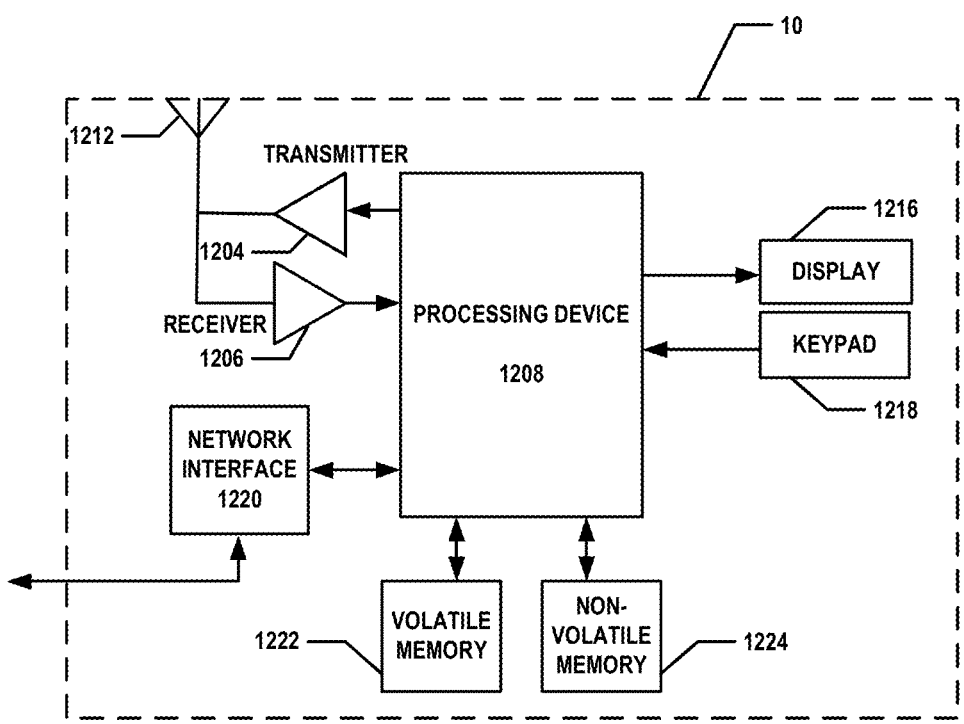

FIG. 12 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "substantially," "generally," and "approximately" refer to within appropriate engineering and/or manufacturing tolerances and/or within user measurement capabilities, unless otherwise indicated. Like numbers refer to like elements throughout.

In various embodiments of a quantum computer, one or more laser pulses may be applied to qubits of the quantum computer to enact quantum logic gates. For example, if the quantum computer is a trapped ion quantum computer, ions may be trapped in an ion trap of the quantum computer and used as qubits of the quantum computer. One or more laser pulses may be applied to one or more ions (e.g., qubits) trapped in the ion trap to perform a quantum logic gate on the one or more qubits embodied by the one or more ions. In various embodiments, quantum computers, systems, apparatus and corresponding methods are provided for the performance of a D-state AC-Stark shift gate, which provides technical solutions for the technical problems facing quantum computing by providing an improved quantum logic gate. To address technical problems facing quantum gates that require high laser power at small wavelengths (e.g., ultra-violet wavelengths), this D-state AC-Stark shift gate provides a solution that operates at longer wavelengths and moderate laser power. For example, in contrast with the technical complications of example P-state gates that use ultraviolet light to operate a Molmer-Sorensen (MS) gate on the $S_{1/2}$ to $P_{1/2}$ transition, this D-state AC-Stark shift gate couples the $S_{1/2}$ manifold to the $D_{3/2}$ manifold using a laser at a visible spectrum transition wavelength $\lambda_0$. In various embodiments, the term visible or visible spectrum refers to light in the wavelength range of approximately 380-740 nm. In an example embodiment, the transition wavelength $\lambda_0$=435 nm. In various embodiments, the manipulation signals used to perform the quantum logic gate include laser pulses characterized by wavelengths that are longer than UV wavelengths (e.g., wavelengths longer than approximately 375-380 nm). These operational advantages significantly reduce the technical complexity of implementation of a quantum logic gate, leading to high fidelity quantum logic gates with low technical overhead.

Various example embodiments of the D-state AC-Stark shift gate provides various advantages over P-state gates. For example, a P-state Molmer-Sorensen (MS) gate may implement phase gates between the two hyperfine states of the $S_{1/2}$ manifold by laser-coupling the $S_{1/2}$ and $P_{1/2}$ manifolds. This D-state AC-Stark shift gate affords several example technical advantages compared to the MS gate, including: (a) the gate lasers may be spectroscopically separated by kHz-MHz (rather than GHz) frequencies, (b) the gate is intrinsically insensitive to optical phases, and (c) the gate is diagonal in the qubit basis, making it more naturally compatible with dynamical decoupling schemes. Table 1 shows a comparison among certain features of P-state and this D-state AC-Stark shift gate:

TABLE 1

Gate Comparison

|  | P-State Molmer-Sorensen Gate | P-State AC-Stark Shift Gate | D-State AC-Stark Shift Gate |
| --- | --- | --- | --- |
| Demonstrated High Fidelity | ~99.9% (NIST) | ~99.9% (Oxford) | >99.99% [Theoretical upper bound] |
| Qubit Compatibility | Clock state compatible | Clock state incompatible | Clock state compatible |
| Optical Phase Sensitivity | Phase sensitive | Phase insensitive | Phase insensitive |
| Diagonal in Qubit Basis | No | Yes | Yes |
| Wavelength Requirements | Ultraviolet | Ultraviolet | Visible |
| Modulation Frequency | ~GHz | ~MHz | ~KHz-MHz |

As can be seen in Table 1, P-state gate configurations require relatively high laser power (e.g., 10 s of mW) at ultra-violet wavelengths and suffer from a variety of other technical challenges likely to impede scalability. For example, the P-state MS gate requires GHz laser modulation and is sensitive to optical phases, while the P-state AC-Stark shift gate cannot be directly combined with a clock-state qubit. The use of clock-state qubits may reduce or eliminate the sensitivity of the qubit to magnetic field noise. Because of the near-detuning used in the proposed D-state AC-Stark shift gate, achieving example state-of-the-art speeds (<100 microseconds) for high fidelity gates inevitably results in the D-states becoming populated during the gate operation. However, the effect of this population on gate fidelity can be reduced or eliminated using pulse shaping techniques. For example, a pulse of one or more manipulation sources provided to one or more ions to perform the gate operation may be shaped to reduce or eliminate the effect on the gate fidelity of ions remaining in a D-state after completion of the gate operation. As an example, a 100 μs gate may be performed with $<10^{-4}$ error due to residual D-state populations by using an approximately 4 μs $\sin^2(t)$ turn on/off of the manipulation signal.

Exemplary Quantum Computer System

FIG. 1 provides a block diagram of an example quantum computer system 100. In various embodiments, the quantum computer system 100 comprises a computing entity 10 and a quantum computer 110. In various embodiments, the quantum computer 110 comprises a controller 30, a cryogenic and/or vacuum chamber 40 enclosing an ion trap 50, a magnetic field generation device 70, and one or more manipulation sources 64 (e.g., 64A, 64B, 64C). One or more ions may be trapped within the ion trap 50 to act as qubits of the quantum computer 110. In an example embodiment, the one or more manipulation sources 64 may comprise one or more lasers (e.g., optical lasers, and/or the like), microwave field sources, and/or the like. In various embodiments, the one or more manipulation sources 64 are configured to manipulate and/or cause a controlled quantum state evolution of one or more ions (e.g., qubits) within the ion trap 50. For example, in an example embodiment, wherein the one or more manipulation sources 64 comprise one or more lasers, the lasers may provide one or more laser beams to the ion trap 50 within the cryogenic and/or vacuum chamber 40. In various embodiments, the manipulation sources 64 may be used to generate manipulation signals that are used to perform gate operations, cooling operations, leakage suppression operations, and/or the like. In an example embodiment, the one or more manipulation sources 64 each provide a laser beam and/or the like to the ion trap 50 via a corresponding beam path 66 (e.g., 66A, 66B, 66C). In various embodiments, at least one beam path 66 comprises a modulator configured to modulate the manipulation signal being provided to the ion trap 50 via the beam path 66. In various embodiments, the manipulation sources 64, modulator, and/or other components of the quantum computer 110 are controlled by the controller 30. In various embodiments, the magnetic field generation device 70 may comprise circuitry coupled to a voltage source (e.g., a current driver or voltage driver), one or more permanent magnets, and/or a combination thereof for generating a magnetic field 55 experienced by ions (e.g., qubits) trapped in the ion trap 50.

In various embodiments, a computing entity 10 is configured to allow a user to provide input to the quantum computer 110 (e.g., via a user interface of the computing entity 10) and receive, view, and/or the like output from the quantum computer 110. The computing entity 10 may be in communication with the controller 30 of the quantum computer 110 via one or more wired or wireless networks 20 and/or via direct wired and/or wireless communications. In an example embodiment, the computing entity 10 may translate, configure, format, and/or the like information/data, quantum computing algorithms, and/or the like into a computing language, executable instructions, command sets, and/or the like that the controller 30 can understand and/or implement.

In various embodiments, the controller 30 is configured to control electrical signal sources and/or drivers controlling the ion trap 50 and/or transport of ions within the ion trap 50, a cryogenic system and/or vacuum system controlling the temperature and pressure within the cryogenic and/or vacuum chamber 40, manipulation sources 64, and/or other systems controlling the environmental conditions (e.g., temperature, humidity, pressure, and/or the like) within the cryogenic and/or vacuum chamber 40 and/or configured to manipulate and/or cause a controlled evolution of quantum states of one or more ions within the ion trap 50. In various embodiments, the ions trapped within the ion trap 50 are used as qubits of the quantum computer 110.

Overview of Exemplary D-state AC-Stark Shift Gate

Various embodiments provide methods for performing a D-state AC-Stark shift gate and quantum computers, systems, and/or apparatus configured and/or programmed to implement an example embodiment of the D-state AC-Stark shift gate. In various embodiments, performing a D-state AC-Stark shift gate includes applying one or more manipulation signals to one or more ions (e.g., two ions) trapped in the ion trap 50 of the quantum computer 110. For example, the controller 30 may cause one or more manipulation sources to provide one or more manipulation signals to one or more ions (e.g., two ions) trapped in the ion trap 50 to perform the D-state AC-Stark shift gate.

In various embodiments, the ions trapped within the ion trap 50 could be $^{171}$Yb+, however they could also be other electronically similar ions. As used herein these electronically similar ions may be singly ionized, have a single valence electron, a low-lying D-state, and have an odd isotope. Examples of ions electronically similar to $^{171}$Yb+ may include calcium, strontium, barium, or other electronically similar ions. As used herein, the term "low lying D-state" indicates that the D-state has an energy level that is lower than the corresponding P-state. While the term ions is used herein, the objects trapped within the trap 50 may be other atomic objects (e.g., atoms) that have a low lying D-state and various embodiments of the D-state AC-Stark shift gate may be enacted thereon.

In various embodiments, a two-level qubit space is defined. In an example embodiment, the two levels of the two-level qubit space may have the same primary quantum number and magnetic quantum number. For example, the two levels of the two-level qubit space may be hyperfine levels of the ion. In an example embodiment, a first level (e.g., $|\downarrow\rangle$) of the two-level qubit space may be the F=0, m=0, $^2S_{1/2}$ state and a second level (e.g., $|\uparrow\rangle$) of the two-level qubit space may be the F=1, m=0, $^2S_{1/2}$ state. Various embodiments may define the qubit space as different pairs of states. For example, the qubit space may be defined as the non-zero magnetic field clock states in Ca, Sr, or Ba, in an example embodiment. In various embodiments, one or more manipulation signals (e.g., gate manipulation signals) may be used to couple at least one level of the two-level qubit space to at least one state of the $^2D_{3/2}$ manifold and/or the $^2D_{5/2}$ manifold.

In various embodiments, a gate is provided that includes the application of two spin-dependent-force (SDF) pulses with an intermediate qubit rotation pulse (e.g., a π pulse) to one or more qubits. Such a gate provides the advantage of allowing for the cancellation of any unwanted AC-Stark shift caused through the application of an SDF pulse. In various embodiments, a gate is provided that includes the application of at least one SDF pulse to one or more qubits. For example, in an example embodiment, a gate is provided that includes application of only one SDF pulse to one or more qubits. In another example, in an example embodiment, a gate is provided that includes application of three or more SDF pulses to one or more qubits.

FIG. 2 provides a flowchart illustrating processes, procedures, operations, and/or the like performed, for example, by a controller 30 of the quantum computer 110, for performing a D-state AC-Stark shift gate, according to an example embodiment. FIG. 3 provides a state transition diagram of an example embodiment and FIG. 7 provides a state transition diagram of another example embodiment. Starting at step/operation 202, a gate operation is initiated. For example, the controller 30 may initiate the gate operation. For example, the controller 30 may execute one or more commands (e.g., from a queue of scheduled commands) to initiate the gate operation. In an example embodiment, initiating the gate operation may include accessing one or more parameters corresponding to the gate from memory (e.g., memory 1110), turning on and/or warming up one or more manipulation sources 64 (e.g., optical lasers, microwave field sources, and/or the like), and/or the like.

At step/operation 204, the controller 30 optionally causes a qubit rotation manipulation source 64A to provide a first analysis manipulation signal to the one or more ions (e.g., two ions). In various embodiments, the first analysis manipulation signal is a π/2 pulse. For example, the π/2 pulse may be a visible laser pulse, microwave field/pulse, and/or the like. In an example embodiment, the first analysis manipulation signal may be part of a diagnostic procedure corresponding to analyzing operation of the D-state AC-Stark shift gate.

At step/operation 206, the controller 30 causes first and second gate manipulation sources 64B, 64C to provide a first spin-dependent force (SDF) pulse. In various embodiments, the first SDF pulse is a composite pulse comprising a first gate manipulation signal generated by a first gate manipulation source 64B and a second gate manipulation signal generated by a second gate manipulation source 64C. In an example embodiment, the first and second gate manipulation signals are generated by a single gate manipulation source. For example, in an example embodiment, the first gate manipulation source 64B generates and provides both the first and second gate manipulation signals. For example, the first and second gate manipulation signals may be modulations of a single laser signal.

In various embodiments, the first gate manipulation signal and the second gate manipulation source may interact to provide the first SDF pulse. In various embodiments, when the first SDF pulse is incident on an ion, the ion experiences a force. The force experienced by the ion is dependent on the internal state of the ion. For example, the first and second gate manipulation signals are configured to apply a force to each ion conditioned on that ion being in a particular state within the set of S-states. For example, if the ion is in a first internal state of the $S_{1/2}$ manifold, the ion experiences a first force when the first SDF pulse is incident on the ion and when the ion is in a second internal state of the $S_{1/2}$ manifold (which is different from the first initial state) the ion experiences a second force when first SDF pulse is incident on the ion, and the first and second forces are different. For example, the first SDF pulse may strongly couple one state of qubit space to one or more states of the $D_{3/2}$ or $D_{5/2}$ manifold and weakly couple the other state of the qubit space to the states of the $D_{3/2}$ or $D_{5/2}$ manifold. In an example embodiment, the first SDF pulse is configured to couple one or more internal states of an ion to the ion's motional state without appreciably altering the population of ions within qubit space and/or the states of the $S_{1/2}$ manifold. In an example embodiment, the first and second gate manipulation signals are configured to couple internal states of the one or more ions to their motional state, while conserving the populations of the one or more ions in each of the set of S-states (i.e. the two qubit levels) to a high degree of accuracy.

Herein the phrase "without appreciably altering the population of ions within the qubit space and/or states of the $S_{1/2}$ manifold," mean that population of ions does not appreciably move between states within the set of S states (e.g., the states of the $S_{1/2}$ manifold and/or the states of the qubit space). For example, the various embodiments provide an AC Stark shift gate, rather than a Molmer Sorensen gate. In various embodiments, the two S states that define the qubit space (e.g., $|\uparrow\rangle$ and $|\downarrow\rangle$) have approximately fixed populations during the gate. In an example embodiment, the transfer of population due to the laser couplings is very small, (e.g., at the level of $10^{-6}$ or $10^{-7}$ for Ytterbium ions in an example embodiment). In various embodiments, there will be some transfer of population to non-qubit states within the S manifold (e.g., states in the $S_{1/2}$ manifold that are not in the qubit space) due to spontaneous decay from the D state during the gate, which will cause a transfer of population within the S states at the $10^{-5}$ to $10^{-4}$ level during the gate operation. However, any population transfer due to the laser couplings will be vanishingly small compared to the (also very small) error of ions being leaked out of the qubit space. Thus, "a high degree of accuracy" means that transfer of population induced by the laser coupling will be well below the transfer of population due to spontaneous emission during the gate, which is already below the $10^{-4}$ level.

In various embodiments, the first gate manipulation signal is characterized by a first laser wavelength and the second gate manipulation signal is characterized by a second laser wavelength and the first and second laser wavelengths are detuned symmetrically within a hyperfine manifold of the set of D-states. In various embodiments, the first and second gate manipulation signals are detuned from another by a beat note frequency $\mu_1 = \omega_{gate} + \delta$. In various embodiments, the first SDF oscillates at the beat note frequency which $\mu_1$, is a frequency that is detuned from the gate mode frequency $\omega_{gate}$ by $\delta$, where $\delta$ may be positive or negative. In various embodiments, the absolute value of $\delta$ (e.g., $|\delta|$) is in the range of approximately 0.1% to 10% of the gate mode frequency $\omega_{gate}$. In various embodiments, $\delta$ is approximately a few kHz to a few hundred kHz. In an example embodiment, $\omega_{gate}$ corresponds the frequency of one normal mode of the ion crystal (e.g., called the gate mode), which is approximately 2 MHz. In various embodiments, the second and third manipulation sources 64B, 64C may be gate lasers (e.g., lasers configured to apply a quantum logic gate to one or more ions).

In various embodiments, the first and second gate manipulation signals are visible spectrum wavelength laser signals, beams, pulses, sets of pulses, and/or the like. In an example embodiment, the first and second gate manipulation signals are infrared or UV wavelength laser signals, beams, pulses, sets of pulses, and/or the like. For example, in an example embodiment, the first and second gate manipulation signals are characterized by a wavelength $\lambda_0 \approx 435$ nm. In an example embodiment, the first and/or second gate manipulation signal is shaped via pulse shaping modulation to include an approximately 4 μs $\sin^2(t)$ rise and fall modulation. In an example embodiment, the ion comprises ytterbium-171 and the first gate manipulation signal and the second gate manipulation signal comprise an approximately 435 nm laser pulse. In various embodiments, the first and second gate manipulation signals may be copropagating (e.g., propagating in parallel directions), non-copropagating (e.g., propagating in non-parallel directions), propagating in orthogonal and/or perpendicular directions, and/or counter-propagating (e.g., propagating in opposite directions), as appropriate for the application.

At step operation 208, the controller 30 causes a qubit rotation manipulation source 64A to provide a qubit rotation manipulation signal to the one or more ions (e.g., two ions). In various embodiments, the qubit rotation manipulation signal is a π pulse. For example, the qubit rotation signal may cause a qubit rotation (e.g., a rotation on the Bloch sphere of a Bloch vector representing the qubit's state) by an angle π radians about an axis in the xy plane (e.g., of the Bloch sphere). In an example embodiment, the qubit rotation caused by the qubit rotation manipulation signal results in the cancellation of any single-ion AC-Stark shift that would otherwise cause an unwanted rotation to accompany the gate. For example, the π pulse may be a visible laser pulse, microwave field/pulse, and/or the like. In various embodiments, the qubit rotation manipulation source 64A that provides the analysis manipulation signal at step/operation 204 may be the same or a different qubit rotation manipulation source 64A as the qubit rotation manipulation source 64A that provides the qubit rotation manipulation signal at step/operation 208.

At step/operation 210, the controller 30 causes first and second gate manipulation sources 64B, 64C to provide a second SDF pulse. In various embodiments, the second SDF pulse is a composite pulse comprising a third gate manipulation signal generated by a first gate manipulation source 64B and a fourth gate manipulation signal generated by a second gate manipulation source 64C. In an example embodiment, the first and second gate manipulation signals are generated by a single gate manipulation source. For example, in an example embodiment, the first gate manipulation source 64B generates and provides both the first and second gate manipulation signals. For example, the third and fourth gate manipulation signals may be modulations of a single laser signal.

In various embodiments, the third gate manipulation signal and the fourth gate manipulation source may interact to provide the second SDF pulse. In various embodiments, when the second SDF pulse is incident on an ion, the ion experiences a force. The force experienced by the ion is dependent on the internal state of the ion. For example, the first and second gate manipulation signals are configured to apply a force to each ion conditioned on that ion being in a particular state within the set of S-states. For example, if the ion is in a first internal state of the $S_{1/2}$ manifold, the ion experiences a first force when the second SDF pulse is incident on the ion and when the ion is in a second internal state of the $S_{1/2}$ manifold (which is different from the first initial state) the ion experiences a second force when second SDF pulse is incident on the ion, and the first and second forces are different. For example, the second SDF pulse may strongly couple one state of qubit space to one or more states of the $D_{3/2}$ or $D_{5/2}$ manifold and weakly couple the other state of the qubit space to the states of the $D_{3/2}$ or $D_{5/2}$ manifold. In an example embodiment, the second SDF pulse is configured to couple one or more internal states of an ion to the ion's motional state without appreciably altering the population of ions within qubit space and/or the states of the $S_{1/2}$ manifold. The third and fourth gate manipulation signals are configured to couple internal states of the one or more ions to their motional state, while conserving the populations of the one or more ions in each of the set of S-states (i.e. the two qubit levels) to a high degree of accuracy.

In various embodiments, the third gate manipulation signal is characterized by a first laser wavelength and the fourth gate manipulation signal is characterized by a second laser wavelength and the first and second laser wavelengths are detuned symmetrically within a hyperfine manifold of the set of D-states. In various embodiments, the first and second gate manipulation signals are detuned from another by a beat note frequency $\mu_2 = \omega_{gate} +/- \delta$. In various embodiments, the second SDF oscillates at the beat note frequency $\mu_2$, which is a frequency that is detuned from the gate mode frequency $\omega_{gate}$ by $+/-\delta$. In various embodiments, the gate mode frequency $\omega_{gate}$ and the magnitude of the detuning frequency $\delta$ are the same as those in step/operation 206. In an example embodiment, the sign of the detuning of $\mu_2$ from the gate mode may be different in step/operation 210 than the sign of the detuning of $\mu_1$ from the gate mode in step/operation 206. For example, the first SDF pulse may be detuned from $\omega_{gate}$ by $\delta$ and the second SDF pulse may be detuned from the gate mode frequency $\omega_{gate}$ by $+/-\delta$. In various embodiments, the first and second gate manipulation sources 64B, 64C may be gate lasers (e.g., lasers configured to applying a quantum logic gate to one or more ions). In various embodiments, the first gate manipulation source 64B that provides the third gate manipulation signal is the same or a different first gate manipulation source 64B that provides the first gate manipulation signal. In various embodiments, the second gate manipulation source 64C that provides the second gate manipulation signal is the same or a different second gate manipulation source 64C that provides the fourth gate manipulation signal. In various embodiments, the third and fourth gate manipulation signals are visible spectrum wavelength laser signals, beams, pulses, sets of pulses, and/or the like. In an example embodiment, the third and fourth gate manipulation signals are infrared or UV wavelength laser signals, beams, pulses, sets of pulses, and/or the like. In an example embodiment, the third and/or fourth gate manipulation signal is shaped via pulse shaping modulation to include an approximately 4 μs $\sin^2(t)$ rise and fall modulation. In an example embodiment, the ion comprises ytterbium-171 and the third gate manipulation signal and the fourth gate manipulation signal comprise an approximately 435 nm laser pulse (e.g., $\lambda_0 \approx 435$ nm). In various embodiments, the third and fourth gate manipulation signals may be copropagating (e.g., propagating in parallel directions), non-copropagating (e.g., propagating in non-parallel directions), propagating in orthogonal and/or perpendicular directions, and/or counter-propagating (e.g., propagating in opposite directions), as appropriate for the application.

At step operation 212, the controller 30 optionally causes a qubit rotation manipulation source 64A to provide a second analysis manipulation signal to the one or more ions (e.g., two ions). In various embodiments, the second analysis manipulation signal is a π/2 pulse. For example, the π/2 pulse may be a visible laser pulse, microwave field/pulse, and/or the like. In various embodiments, the qubit rotation manipulation source 64A that provides the first analysis manipulation signal at step/operation 204 and/or the qubit rotation manipulation signal at step/operation 208 may be the same or a different qubit rotation manipulation source 64A as the qubit rotation manipulation source 64A that provides the second analysis manipulation signal pulse at step/operation 212. In an example embodiment, the second analysis manipulation signal may be part of a diagnostic procedure corresponding to analyzing operation of the D-state AC-Stark shift gate.

At step/operation 214, the controller 30 may determine that the gate operation has been completed. For example, the controller 30 may update a log (e.g., stored in memory 1110) to indicate that the gate operation was performed. In various embodiments, the log may comprise one or more qubit records and the qubit records corresponding to the qubits and/or ions addressed by the gate operation may be updated to indicate that the gate operation was performed.

Two example embodiments of a D-state AC-Stark shift gate will now be described in more detail. The example embodiment described with respect to FIGS. 3-6 of the D-state AC-Stark shift gate is detuned outside the hyperfine manifold and another example embodiment described with respect to FIGS. 7-10 is detuned symmetrically within the hyperfine manifold. Both the first and second example embodiments may be implemented with slightly different variations in choices of the excited state and the ground state. In various embodiments, the $S_{1/2}(F=0) \rightarrow D_{3/2}(F=1)$ transition is forbidden. The example embodiment described with respect to FIGS. 3-6 has the benefit of being far off-resonant with all the motional sidebands of the ions. The example embodiment described with respect to FIGS. 7-10 has the advantage of nulling the time-independent AC-stark shift using just two tones (e.g., the first and second gate manipulation signals 330A and 330B or 730A and 730B (or third and fourth gate manipulation signals) that, in combination, provide the first SDF pulse (or the second SDF pulse)).

An Example Embodiment of a D-state AC-Stark Shift Gate

FIGS. 3-6 provide various diagrams illustrating an example embodiment of a D-state AC-Stark shift gate. For example, FIG. 3 provides a state transition diagram, according to the example embodiment; FIG. 4 provides a schematic diagram showing the performance of an example gate on ions trapped in a surface ion trap, according to the example embodiment; FIG. 5 provides a block diagram showing a Bloch sphere representation of a phase gate protocol, according to the example embodiment; and FIG. 6 provides performance measurement results, according to the example embodiment.

Diagram 300 of FIG. 3 shows how the example embodiment of the D-state AC-Stark shift gate couples the $S_{1/2}$ manifold 320 comprising a two-level qubit space to the $D_{3/2}$ manifold 310 using a manipulation signal 330 (e.g., 330A, 330B; an SDF pulse) at a transition wavelength $\lambda_0$. The states represented by the solid lines of the $S_{1/2}$ manifold 320 (e.g., the F=0, m=0, $S_{1/2}$ state and the F=1, m=0, $S_{1/2}$ state) that are coupled to the states represented by the solid lines of the $D_{3/2}$ manifold 310 (e.g., the F=2, m=−2, 0, 2, $D_{3/2}$ states) by the gate manipulation signals 330. The states of the $D_{3/2}$ manifold 310 and $S_{1/2}$ manifold 320 that are not coupled via the gate manipulation signals 330 are shown as dotted lines. In various embodiments, one state of the qubit space (e.g., $|\downarrow\rangle$) couples near-resonantly (and therefore strongly) to at least one state of the $D_{3/2}$ manifold 310 and the other state of the qubit space (e.g., $|\uparrow\rangle$ couples far-off-resonantly (and therefore weakly) to the states of the $D_{3/2}$ manifold 310. Therefore, application of the SDF pulse generates a state dependent force on ions within the qubit space. For example, ions in the $|\downarrow\rangle$ state of the qubit space will experience a force while ions in the $|\uparrow\rangle$ state of the qubit space will experience almost no force when the SDF pulse is incident upon the ions.

In an example embodiment, the transition wavelength $\lambda_0$=435 nm. Diagram 300 shows the level scheme for a trapped ion architecture with singly ionized ytterbium-171 ($^{171}$Yb+), however similar level schemes apply for electronically similar ions. As used herein these electronically similar ions may be singly ionized, have a single valence electron, and have an odd isotope, and have a low-lying D-state. Examples of ions electronically similar to $^{171}$Yb+ may include calcium, strontium, barium, or other electronically similar ions. In an example, $^{171}$Yb+ may use a manipulation signal characterized by a transition wavelength $\lambda_0$=435 nm to couple the $S_{1/2}$ manifold 320 to the $D_{3/2}$ manifold 310.

Table 2 shows some performance analysis estimates for this D-state AC-Stark shift gate. In various embodiments, the gate time corresponds to the time to perform the gate operation (e.g., as described and/or illustrated in FIG. 2). In various embodiments, the residual mode occupants correspond to the likelihood of an ion not returning to its original motional state upon completion of the gate operation. The fidelity measure indicates the fidelity of the gate operation. The spontaneous emission probability indicates the probability that an ion will de-excite from the $D_{3/2}$ manifold 310 via spontaneous emission during performance of the gate operation.

TABLE 2

Theoretical performance analysis

| | |
|---|---|
| Gate Time (includes pulse shaping rise/fall, and assumes 50 mW laser power, 20 µm beam waist) | $t_{gate} \approx 103$ µs |
| Residual Mode Occupations | $\bar{n} < 10^{-4}$ |
| Residual Excited State Population (enabled at near detuning by pulse shaping) | $P_e \ll 10^{-4}$ |
| Fidelity (intrinsic infidelity sources, e.g. Lamb-Dicke, spectator modes, off-resonant carrier) | $F \sim 1 - 2 \times 10^{-4}$ |
| Spontaneous Emission Probability (enabled at near detuning by long lifetime of D state) | $P_{scatter} \leq 10^{-4}$ |

FIG. 4 is a block diagram showing a geometric configuration 400 of a gate operation, according to an embodiment. The ion trap 50 may be used to implement the D-state AC-Stark shift gate described herein. The ion trap 50 may be used to trap ions 52 (e.g., 52A, 52B), such as $^{171}$Yb+ or electronically similar ions. The ion trap 50 is coupled (e.g., via beam paths 66) with one or more manipulation sources. For example, the first gate manipulation source 64B may generate a first gate manipulation signal 420. In an example embodiment, the first gate manipulation signal 420 is applied after the application of a first analysis manipulation signal which, in various embodiments, is a π/2 visible light or microwave field/pulse, and approximately simultaneously to a second gate manipulation signal 430. In various embodiments, the first and second manipulation signals are detuned from one another by beat note frequency µ. In an example embodiment, the polarization 425 of the first gate manipulation signal 420 is in the plane of the page. For example, a second gate manipulation source 64C may generated a second gate manipulation signal 430. In an example embodiment, the polarization 435 of the second gate manipulation signal 430 is in the plane of the page. In various embodiments, the first and second gate manipulation signals together form the first SDF pulse. In an example, two-qubit gates use both the first and second gate manipulation signals 420, 430, though a single-qubit gate may be implemented using one of the first or second gate manipulation signals 420, 430 and added microwave addressing (e.g., a microwave manipulation signal (e.g., microwave field/pulse) may be applied in combination with one of the first or second gate manipulation signals 420, 430). The first gate manipulation signal 420 and the second gate manipulation signal 430 may be arranged to be transverse with respect to each other. As used herein, the term transverse means not parallel. For example, the first manipulation gate signal 420 and the second gate manipulation signal 430 are not copropagating and are therefore transverse to one another. In an example embodiment, the first gate manipulation signal 420 and the second gate manipulation signal 430 may be arranged to be approximately and/or substantially perpendicular/orthogonal to one another. In an example, first and second gate manipulation signals 420, 430 are linearly polarized (e.g., 425, 435) in the plane of the surface of the ion trap 50. In an example embodiment, the third gate manipulation signal may be geometrically substantially the same as the first gate manipulation signal 420 and the fourth gate manipulation signal may be geometrically substantially the same as the second gate manipulation signal 430. For example, the third gate manipulation signal may have linear polarization in the plane of the surface of the ion trap 50, substantially similar to polarization 425 of the first gate manipulation signal 420. For example, the fourth gate manipulation signal may have linear polarization in the plane of the surface of the ion trap 50, substantially similar to polarization 435 of the second gate manipulation signal 430. However, in an example embodiment, when performing a single qubit gate, the third and fourth gate manipulation signals together form a second SDF pulse that has a frequency that is approximately 2δ more or less than the frequency of the first SDF pulse formed by the combination of the first and second gate manipulation signals 420, 430. In various embodiments, the third and fourth gate manipulation signals together form a second SDF pulse that is characterized by a frequency that is approximately equal to the first SDF pulse when implementing a two-qubit gate. In various embodiments, the third and fourth manipulation signals are detuned from one another by beat note frequency µ. In various embodiments, the first, second, third, and/or fourth manipulation signals may be shaped pulses configured to reduce the residual D manifold population.

To couple the $S_{1/2}$ manifold to the $D_{3/2}$ manifold in $^{171}$Yb+, a two-qubit D-state AC-Stark shift gate includes first and second gate manipulation signals 420, 430, the combination of which is a first SDF pulse, and the second and third gate manipulation signals, the combination of which is a second SDF pulse, that operate at approximately a transition wavelength $\lambda_0$. For example, the first and second gate manipulation signals 420, 430 (and the third and fourth gate manipulation signals) may be detuned from one another such that interaction of the first and second gate manipulation signals 420, 430 (and the third and fourth gate manipulation signals) results in a beat note frequency of $\mu = \omega_{gate} + \delta$. This beat note frequency is the oscillation frequency of the first/second SDF. In various embodiments, the beat note frequency is selected to be detuned from the gate mode frequency $\omega_{gate}$ by +δ, where δ is in the range of approximately a few kHz to a few hundred kHz. In an example embodiment, the transition wavelength $\lambda_0 \approx 435$ nm. While the transition wavelength $\lambda_0 \approx 435$ nm are used for operation using $^{171}$Yb+, different wavelength lasers would be used for other electronically similar ions. In an example embodiment, the frequency of the first gate manipulation signal 330A (e.g., approximately $c/\lambda_0$ where c is the speed of light) and the frequency of a reference state of the $D_{3/2}$ manifold are offset from one another by an offset frequency Δ. In an example embodiment, the offset frequency is Δ≈12 MHz. In an example embodiment, the first and second SDF pulses couple to the F=2, m=−2, 0, +2, $^2D_{3/2}$ states.

The ion trap 50 may include a magnetic field generating device to generate a magnetic field 55. In an example, magnetic field 55 may provide a magnetic field of approximately 5 gauss, though other magnetic field values may be used. This D-state AC-Stark shift gate may provide two-qubit gates, which may be implemented by generating magnetic field 55 in combination with the first and second gate manipulation signals 420, 430 and the third and fourth gate manipulation signals.

FIG. 5 is a block diagram showing a Bloch sphere representation of a phase gate protocol 500, according to an example embodiment. In particular, protocol 500 demonstrates operating a single-qubit gate using the two-qubit gate strategy, which may be extended to implement a two-qubit D-state AC-Stark shift gate described. Protocol 500 may begin with first state 510, which represents |Ψ⟩=|↓⟩. A first analysis manipulation signal (e.g., π/2 laser or microwave field/pulse) may be optionally applied to transition from first state 510 to second state 520, which represents (|↓⟩+|↑⟩)/√2, as described with respect to step/operation 204. The first and second gate manipulation sources are then used to apply a first SDF oscillating at a frequency that is detuned from the gate mode frequency $\omega_{gate}$ by +δ, which transforms the state represented by 520 into a new state $(e^{i(\Phi+\varphi_{ac})}|\downarrow\rangle+|\uparrow\rangle)/\sqrt{2}$ represented by 530, as described with respect to step/operation 206. A qubit rotation manipulation signal (e.g., π laser pulse) may be applied to transition from third state 530 to fourth state 540, which represents $(|\downarrow\rangle+e^{i\Phi+\varphi_{ac}}|\uparrow\rangle)/\sqrt{2}$, where $\varphi_{ac}$ is the AC-Stark shift experienced by the ion and Φ is a geometric phase imparted by the SDF pulse, as described with respect to step/operation 208. A second SDF pulse (e.g., generated from the combination of the third and fourth gate manipulation signals) detuned from the gate mode frequency $\omega_{gate}$ by −δ may be applied to transition from fourth state 540 to fifth state 550, which represents $e^{i\varphi_{ac}}(e^{-i\Phi}|\downarrow\rangle+e^{i\Phi}|\uparrow\rangle)/\sqrt{2}$, as described with respect to step/operation 210. Finally, a second analysis manipulation signal (e.g., a π/2 laser pulse) may be optionally applied to transition from fifth state 550 to sixth state 560, which represents $|\Psi_f\rangle=\cos\Phi|\downarrow\rangle+\sin\Phi|\uparrow\rangle$. The sixth state 560 corresponds to a bright/up state probability of $P_{bright}=|\langle\uparrow|\Psi_f\rangle|^2=\cos^2\Phi$, such as described in FIG. 6 below.

FIG. 6 illustrates a performance measurement result 600 achieved with an example embodiment. Result 600 shows the measurement scheme 610 and a corresponding performance plot 620. Plot 620 shows the bright/up state probability as a function of gate manipulation source power level. In particular, plot 620 shows measured data points 630, an ideal theoretical bright/up state probability curve 640, and a theoretical bright/up state curve 650 derived by including the effect of heating at an independently measured rate of 1000 quanta per second. As shown in plot 620, the similarities show good agreement between data and theory (with independently measured heating included) with an associated fidelity $F_\pi$, =87(1)%, which demonstrates consistency in the behavior expected for a geometric phase gate. Additionally, the data is consistent with the ~13% infidelity (e.g., $1-F_\pi$) being due almost entirely to heating, which would be nearly eliminated for a two-qubit gate by using an odd-parity gate mode.

Another Example Embodiment of a D-State AC-Stark Shift Gate

FIGS. 7-10 provide various diagrams illustrating an example embodiment of a D-state AC-Stark shift gate. FIG. 7 provides a state transition diagram, according to another example embodiment; FIG. 8 provides a schematic diagram showing the performance of an example gate on ions trapped in a surface ion trap, according to an example embodiment; FIG. 9 provides a block diagram showing a representation of a phase gate protocol, according to an example embodiment; and FIG. 10 provides a plot illustrating performance measurement results, according to an example embodiment.

Diagram 700 of FIG. 7 shows how the example embodiment of the D-state AC-Stark shift gate couples the $S_{1/2}$ manifold 720 comprising a two-level qubit space 54 to the $D_{3/2}$ manifold 710 using one or more manipulation signals 730 (e.g., 730A, 730B, which combine to provide an SDF pulse) at a transition wavelength $\lambda_0$. The states represented by the solid lines of the $S_{1/2}$ manifold 720 (e.g., the F=0, m=0, $S_{1/2}$ state and the F=1, m=0, $S_{1/2}$ state) that are coupled to the states represented by the solid lines of the $D_{3/2}$ manifold 710 (e.g., the F=1, m=−1, 1, $D_{3/2}$ states) by the gate manipulation signals 730. The states of the $D_{3/2}$ manifold 710 and $S_{1/2}$ manifold 720 that are not coupled via the gate manipulation signals 730 are shown as dotted lines. In various embodiments, one state of the qubit space (e.g., $|\uparrow\rangle$) couples strongly to at least one state of the $D_{3/2}$ manifold 710 and the other state of the qubit space (e.g., $|\downarrow\rangle$) couples weakly to the states of the $D_{3/2}$ manifold 710. Therefore, application of the SDF pulse generates a state dependent force on ions within the qubit space. For example, ions in the $|\downarrow\rangle$ state of the qubit space will experience a different force than ions in the $|\uparrow\rangle$ state of the qubit space when the SDF pulse is incident upon the ions.

In an example embodiment, the transition wavelength $\lambda_0$=435 nm. Diagram 700 shows the level scheme for a trapped ion architecture with singly ionized ytterbium-171 ($^{171}$Yb+), however similar level schemes apply for electronically similar ions. As used herein these electronically similar ions may be singly ionized, have a single valence electron, a low-lying D-state, and have an odd isotope. Examples of ions electronically similar to $^{171}$Yb+ may include calcium, strontium, barium, or other electronically similar ions. In an example, $^{171}$Yb+ may use a manipulation signal characterized by a transition wavelength $\lambda_0$≈435 nm to couple the $S_{1/2}$ manifold 720 to the $D_{3/2}$ manifold 710.

FIG. 8 is a block diagram showing a geometric configuration 800 of a gate operation, according to an embodiment. The ion trap 50 may be used to implement the D-state AC-Stark shift gate described herein. The ion trap 50 may be used to trap ions 52 (e.g., 52A, 52B), such as $^{171}$Yb+ or electronically similar ions. The ion trap 50 is coupled (e.g., via beam paths 66) with one or more manipulation sources. For example, the first gate manipulation source 64B may generate a first gate manipulation signal 820 (e.g., which may be applied after the optional application of a first analysis manipulation signal which, in various embodiments, is a π/2 visible light or microwave field/pulse, and approximately simultaneously to a second gate manipulation signal 830). In various embodiments, the first and second manipulation signals are detuned from one another by beat note frequency µ. In an example embodiment, the polarization 825 of the first gate manipulation signal 820 is in the plane of the page. For example, a second gate manipulation source 64C may generated a second gate manipulation signal 830. In an example embodiment, the polarization 835 of the second gate manipulation signal 830 is out of the plane of the page. In various embodiments, the first and second gate manipulation signals together form the first SDF pulse. In an example, two-qubit gates use both the first and second gate manipulation signals 820, 830, though a single-qubit gate may be implemented using one of the first or second gate manipulation signals 820, 830 and added microwave addressing (e.g., a microwave manipulation signal (e.g., microwave field/pulse) may be applied in combination with one of the first and second gate manipulation signals 820, 830). The first gate manipulation signal 820 and the second gate manipulation signal 830 may be arranged to be transverse with respect to each other (e.g., not copropagating). In an example embodiment, the first gate manipulation signal 820 and the second gate manipulation signal 830 may be arranged to be approximately and/or substantially perpendicular/orthogonal to one another. In an example, first and second gate manipulation signals 820, 830 are linearly polarized (e.g., 825, 835) with the polarization 825 of the first gate manipulation signal 820 being in the plane of the surface of the ion trap 50 and the polarization 835 of the second gate manipulation signal 830 being transverse and/or approximately orthogonal to the plane of the surface of the ion trap 50. In an example embodiment, the third gate manipulation signal may be geometrically substantially the same as the first gate manipulation signal 820 and the fourth gate manipulation signal may be geometrically substantially the same as the second gate manipulation signal 830. For example, the third gate manipulation signal may have linear polarization in the plane of the surface of the ion trap 50, substantially similar to polarization 825 of the first gate manipulation signal 820. For example, the fourth gate manipulation signal may have linear polarization in the plane of the surface of the ion trap 50, substantially similar to polarization 835 of the second gate manipulation signal 830. In various embodiments, the third and fourth manipulation signals are detuned from one another by beat note frequency μ.

To couple the $S_{1/2}$ manifold to the $D_{3/2}$ manifold in $^{171}$Yb+, a two-qubit D-state AC-Stark shift gate includes first and second gate manipulation signals 820, 830, the combination of which is a first SDF pulse, and the third and fourth gate manipulation signals, the combination of which is a second SDF pulse, that operate at approximately a transition wavelength $\lambda_0$. For example, the first and second gate manipulation signals 820, 830 (and the third and fourth gate manipulation signals) may be detuned from one another such that interaction of the first and second gate manipulation signals 820, 830 (and the third and fourth gate manipulation signals) results in a beat note frequency of $\omega_{gate}+\delta$. This beat note frequency is the oscillation frequency of the first/second SDF. In various embodiments, the beat note frequency is selected to be detuned from the gate mode frequency $\omega_{gate}$ by δ, where δ is in the range of approximately a few kHz to a few hundred kHz. In an example embodiment, the transition wavelength $\lambda_0 \approx 435$ nm. While the transition wavelength $\lambda_0 \approx 435$ nm are used for operation using $^{171}$Yb+, different wavelength lasers would be used for other electronically similar ions. In an example embodiment, the first and second SDF pulses couple to the F=1, m=−1, +1, $D_{3/2}$ states.

The ion trap 50 may include a magnetic field generating device to generate a magnetic field 55. In an example, magnetic field 55 may provide a magnetic field of approximately 5 gauss, though other magnetic field values may be used. This D-state AC-Stark shift gate may provide two-qubit gates, which may be implemented by generating magnetic field 55 in combination with the first and second gate manipulation signals 820, 830 and the third and fourth gate manipulation signals. In various embodiments, the first, second, third, and/or fourth manipulation signals may be shaped pulses configured to reduce the residual D manifold population.

FIG. 9 is a block diagram representing a phase gate protocol 900, according to an example embodiment. In particular, protocol 900 demonstrates operating a two-qubit D-state AC-Stark shift gate of an example embodiment. Protocol 900 may begin with first state 910, which represents $|\Psi\rangle=|\downarrow\downarrow\rangle$. A analysis manipulation signal (e.g., π/2 laser or microwave field/pulse) may be applied to transition from first state 910 to second state 920, which represents $(|\downarrow\downarrow\rangle+|\downarrow\uparrow\rangle+|\uparrow\downarrow\rangle+|\uparrow\uparrow\rangle)/2$, as described with respect to step/operation 204. The first and second gate manipulation sources are then used to apply a first SDF oscillating at a frequency that is detuned from the gate mode frequency $\omega_{gate}$ by δ, which transforms the state represented by 920 into a new state state represented by 930 (e.g., $$\left(|\downarrow\downarrow\rangle + e^{\frac{i\pi}{4}+i\varphi_{AC}}|\downarrow\uparrow\rangle + e^{\frac{i\pi}{4}+i\varphi_{AC}}|\uparrow\downarrow\rangle + e^{2i\varphi_{AC}}|\uparrow\uparrow\rangle\right)/2,$$

where $\varphi_{AC}$ is a phase due to the AC-Stark shift experienced by the ions) as described with respect to step/operation 206. A qubit rotation manipulation signal (e.g., π laser pulse) may be applied to transition from third state 930 to fourth state 940, which represents the state $$\left(e^{2i\varphi_{AC}}|\downarrow\downarrow\rangle + e^{\frac{i\pi}{4}+i\varphi_{AC}}|\downarrow\uparrow\rangle + e^{\frac{i\pi}{4}+i\varphi_{AC}}|\uparrow\downarrow\rangle + |\uparrow\uparrow\rangle\right)/2,$$

as described with respect to step/operation 208. A second SDF pulse (e.g., generated by the combination of the third and fourth gate manipulation signals) detuned from the gate mode frequency $\omega_{gate}$ by δ may be applied to transition from fourth state 940 to fifth state 950, which represents $(|\downarrow\downarrow\rangle+e^{i\pi/2}|\downarrow\uparrow\rangle+e^{i\pi/2}|\uparrow\downarrow\rangle+|\uparrow\uparrow\rangle)/2$, as described with respect to step/operation 210. Finally, a second analysis manipulation signal (e.g., a π/2 laser pulse) may optionally be applied to transition from fifth state 950 to sixth state 960, which represents $|\Psi_f\rangle=(|\downarrow\downarrow\rangle+|\uparrow\uparrow\rangle)/\sqrt{2}$.

FIG. 10 illustrates a performance measurement result plot 1000, according to an example embodiment. In particular, the plot 1000 shows data 1010 and a best fit line 1020 of the randomized benchmarking (RB) decay curve. For example, the plot 1000 illustrates that the symmetric-subspace randomized benchmarking (SSRB) yields gate fidelity of 99.50 (5)%. The residual infidelity is believed to be due primarily to laser noise and heating during performance of the gate protocol 900, leading to a residual D-state population after performance of the gate. Theoretical modeling suggests that the D-state population can be suppressed below the $10^{-4}$ level. In various embodiments, spontaneous emission error is suppressed to below the $10^{-4}$ level when the magnetic field 55 is set at 5 gauss.

TECHNICAL ADVANTAGES

Various embodiments provide a method for performing a D-state AC-Stark shift gate and quantum computers, systems, and/or apparatus in which such a method may be implemented. To address technical problems facing quantum gates that require high laser power at small wavelengths (e.g., ultra-violet wavelengths), example embodiments of the D-state AC-Stark shift gate provides a solution that operates at longer wavelengths and moderate laser power. For example, in contrast with the technical complications of P-state gates that use ultraviolet light to operate a Molmer-Sorensen (MS) gate on the $S_{1/2}$ to $P_{1/2}$ transition, example embodiments of the D-state AC-Stark shift gate couples the $S_{1/2}$ manifold to the $D_{3/2}$ manifold using a laser at transition wavelength $\lambda_0$. In an example embodiment, the transition wavelength $\lambda_0$=435 nm. These operational advantages significantly reduce the technical complexity of implementation of a quantum logic gate, in some examples, leading to high fidelity quantum logic gates with low technical overhead.

Various example embodiments of the D-state AC-Stark shift gate provides various advantages over P-state gates. For example, a P-state Molmer-Sorensen (MS) gate may implement phase gates between the two hyperfine states of the $S_{1/2}$ manifold by laser-coupling the $S_{1/2}$ and $P_{1/2}$ manifolds. This D-state AC-Stark shift gate affords several technical advantages compared to the MS gate, including: (a) the gate lasers may be spectroscopically separated by kHz-MHz (rather than GHz) frequencies, (b) the gate is intrinsically insensitive to optical phases, and (c) the gate is diagonal in the qubit basis, making it more naturally compatible with dynamical decoupling schemes.

Exemplary Controller

In various embodiments, a quantum computer 110 further comprises a controller 30 configured to control various elements of the quantum computer 110. In various embodiments, a controller 30 may be configured to cause a quantum computer 110 to perform various operations (e.g., computing operations such as gate operations, cooling operations, transport operations, qubit interaction operations, qubit reading operations, and/or the like), leakage suppression operations, and/or the like). For example, the controller 30 may be configured to cause first, second, and third manipulation sources 64A, 64B, 64C to provide manipulation signals to enact a D-state AC-Stark shift gate of an example embodiment. In various embodiments, the controller 30 may be configured to control a cryogenic system and/or vacuum system controlling the temperature and pressure within the cryogenic and/or vacuum chamber 40, manipulation sources 64, and/or other systems controlling the environmental conditions (e.g., temperature, humidity, pressure, and/or the like) within the cryogenic and/or vacuum chamber 40 and/or configured to manipulate and/or cause a controlled evolution of quantum states of one or more ions within the ion trap 50.

As shown in FIG. 11, in various embodiments, the controller 30 may comprise various controller elements including processing elements 1105, memory 1110, driver controller elements 1115, a communication interface 1120, analog-digital converter elements 1125, and/or the like. For example, the processing elements 1105 may comprise programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like, and/or controllers. The term circuitry may refer to an entirely hardware embodiment or a combination of hardware and computer program products. In an example embodiment, the processing element 1105 of the controller 30 comprises a clock and/or is in communication with a clock.

For example, the memory 1110 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, DIMM SIMM VRAM, cache memory, register memory, and/or the like. In various embodiments, the memory 1110 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 1110 (e.g., by a processing element 1105) causes the controller 30 to perform one or more steps, operations, processes, procedures and/or the like described herein.

In various embodiments, the driver controller elements 1115 may include one or more drivers and/or controller elements each configured to control one or more drivers. In various embodiments, the driver controller elements 1115 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 1105). In various embodiments, the driver controller elements 1115 may enable the controller 30 to operate a manipulation sources 64, operate vacuum and/or cryogenic systems, and/or the like. In various embodiments, the drivers may be laser drivers; microwave drivers; vacuum component drivers; cryogenic and/or vacuum system component drivers; current drivers, and/or the like. For example, the drivers and/or driver controllers may be configured to cause the magnetic field generation device 70 (e.g., comprising circuitry coupled to a voltage source (e.g., a current driver or voltage driver), permanent magnet(s), and/or a combination thereof) to generate a magnetic field having a particular direction and magnitude at one or more positions of the ion trap 50. In various embodiments, the controller 30 comprises means for communicating and/or receiving signals from one or more optical receiver components such as cameras, MEMs cameras, CCD cameras, photodiodes, photomultiplier tubes, and/or the like. For example, the controller 30 may comprise one or more analog-digital converter elements 1125 configured to receive signals from one or more optical receiver components, calibration sensors, and/or the like.

In various embodiments, the controller 30 may comprise a communication interface 1120 for interfacing and/or communicating with a computing entity 10. For example, the controller 30 may comprise a communication interface 1120 for receiving executable instructions, command sets, and/or the like from the computing entity 10 and providing output received from the quantum computer 110 (e.g., from an optical collection system) and/or the result of a processing the output to the computing entity 10. In various embodiments, the computing entity 10 and the controller 30 may communicate via a direct wired and/or wireless connection and/or one or more wired and/or wireless networks 20.

Exemplary Computing Entity

FIG. 12 provides an illustrative schematic representative of an example computing entity 10 that can be used in conjunction with embodiments of the present invention. In various embodiments, a computing entity 10 is configured to allow a user to provide input to the quantum computer 110 (e.g., via a user interface of the computing entity 10) and receive, display, analyze, and/or the like output from the quantum computer 110. For example, a user may operate a computing entity 10 to generate and/or program a quantum algorithm and/or quantum circuit (e.g., that includes a D-state AC-Stark shift gate) that may be provided such that the controller 30 may receive the quantum algorithm and/or quantum circuit and cause the quantum computer 110 to perform the quantum algorithm and/or quantum circuit.

As shown in FIG. 12, a computing entity 10 can include an antenna 1212, a transmitter 1204 (e.g., radio), a receiver 1206 (e.g., radio), and a processing element 1208 that provides signals to and receives signals from the transmitter 1204 and receiver 1206, respectively. The signals provided to and received from the transmitter 1204 and the receiver 1206, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MIMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 1216 and/or speaker/speaker driver coupled to a processing element 1208 and a touch screen, keyboard, mouse, and/or microphone coupled to a processing element 1208). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 1218 (hard or soft), a touch display, voice/speech or motion interfaces, scanners, readers, or other input device. In embodiments including a keypad 1218, the keypad 1218 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 1222 and/or non-volatile storage or memory 1224, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

CONCLUSION

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A quantum computing D-state AC-Stark shift gate system comprising:
    a first gate manipulation source configured to generate a first gate manipulation signal at a first laser wavelength;
    a second gate manipulation source configured to generate a second gate manipulation signal at a second laser wavelength;
    an ion trap; and
    one or more ions trapped within the ion trap,
    wherein the first gate manipulation signal is configured to couple a set of S-states and a set of D-states of the one or more ions,
    wherein the second gate manipulation signal is configured to couple said set of S-states and said set of D-states of the one or more ions,
    wherein a force applied to an ion of the one or more ions by the first and second gate manipulation signals is dependent on the internal state of the ion, and
    wherein the first and second gate manipulation signals are configured to couple internal states of the one or more ions to their motional state without appreciably altering a population of the one or more ions within the set of S-states.

2. The system of claim 1, wherein the system includes a magnetic field generating device configured to generate a magnetic field.

3. The system of claim 1, wherein the second gate manipulation signal propagates in a direction not parallel to the first gate manipulation signal.

4. The system of claim 3, wherein the second gate manipulation signal propagates in a direction approximately perpendicular to the first gate manipulation signal.

5. The system of claim 4, wherein:
the first gate manipulation signal is polarized having a first orientation; and
the second gate manipulation signal is polarized having a second orientation substantially perpendicular to the first orientation;
wherein the polarizations lie within a plane defined by the propagation directions of the two gate manipulation signals.

6. The system of claim 4, wherein:
the first gate manipulation signal is polarized in a plane having a first orientation; and
the second gate manipulation signal is polarized out of the plane having a second orientation substantially perpendicular to the first orientation;
wherein the plane is defined by the propagation directions of the two gate manipulation signals.

7. The system of claim 3, wherein the second gate manipulation signal propagates in a direction approximately opposite to the first gate manipulation signal.

8. The system of claim 1, wherein the second gate manipulation signal propagates in a direction approximately parallel to the first gate manipulation signal.

9. The system of claim 1, wherein the first and second gate manipulation signals are modulations of a common gate manipulation signal.

10. The system of claim 1, wherein the first gate manipulation source is configured to couple the ion off-resonantly between a subset of the S-states and a subset of the D-states and the second gate manipulation source is configured to couple the ion off-resonantly between said subset of S-states and said subset of D-states.

11. The system of claim 1, wherein the first laser wavelength is a first visible spectrum laser wavelength, and the second laser wavelength is a second visible spectrum laser wavelength.

12. The system of claim 1, wherein the first laser wavelength is a first infrared or ultra-violet spectrum laser wavelength, and the second laser wavelength is a second infrared or ultra-violet spectrum laser wavelength.

13. The system of claim 1, wherein the first laser wavelength and the second laser wavelength are detuned outside a hyperfine manifold of the set of D-states.

14. The system of claim 1, wherein the first laser wavelength and the second laser wavelength are detuned within a hyperfine manifold of the set of D-states.

15. The system of claim 14, wherein the first laser wavelength and the second laser wavelength are detuned symmetrically within the hyperfine manifold of the set of D-states.

16. The system of claim 1, wherein the first gate manipulation signal and the second gate manipulation signal include a pulse shaping modulation to reduce the population of the D-states upon completion of the gate operation.

17. The system of claim 16, wherein the pulse shaping modulation includes a rise and fall modulation in the form $\sin^2(t)$.

18. The system of claim 1, wherein the one or more ions are ions that have a low-lying D-state.

19. The system of claim 18, wherein the one or more ions comprise at least one of singly ionized ytterbium, singly ionized barium, singly ionized strontium, or singly ionized calcium.

20. A quantum computing D-state AC-Stark shift gate method comprising:
generating a first gate manipulation signal at a first laser wavelength using a first gate manipulation source, said first gate manipulation signal configured to couple a set of S-states of one or more ions trapped within an ion trap to a set of D-states of the one or more ions;
generating a second gate manipulation signal at a second laser wavelength using a second gate manipulation source, said second gate manipulation source configured to couple said set of S-states to said set of D-states of the one or more ions; and
applying said first gate manipulation signal and said second gate manipulation signal to the one or more ions,
wherein a force applied to an ion of the one or more ions by the first and second gate manipulation signals is dependent on the internal state of the ion, and
wherein the first and second gate manipulation signals are configured to couple internal states of the one or more ions to their motional state without appreciably altering a population of the one or more ions within the set of S-states.

* * * * *